United States Patent
Romalis et al.

(10) Patent No.: US 7,521,928 B2
(45) Date of Patent: *Apr. 21, 2009

(54) SUBFEMTOTESLA RADIO-FREQUENCY ATOMIC MAGNETOMETER FOR NUCLEAR QUADRUPOLE RESONANCE DETECTION

(75) Inventors: Michael V. Romalis, Princeton, NJ (US); Karen L. Sauer, Fairfax, VA (US); Igor M. Savukov, El Cerrito, CA (US); Scott J. Seltzer, Howell, NJ (US); Seung-Kyun Lee, Princeton, NJ (US)

(73) Assignee: Trustees of Princeton University, Princeton, NJ (US)

( * ) Notice: Subject to any disclaimer, the term of this patent is extended or adjusted under 35 U.S.C. 154(b) by 106 days.

This patent is subject to a terminal disclaimer.

(21) Appl. No.: 11/593,739

(22) Filed: Nov. 7, 2006

(65) Prior Publication Data
US 2008/0106261 A1 May 8, 2008

(51) Int. Cl.
*G01V 3/00* (2006.01)
(52) U.S. Cl. ................................. 324/304; 324/301
(58) Field of Classification Search .............. 324/404, 324/301, 318, 322, 304
See application file for complete search history.

(56) References Cited

U.S. PATENT DOCUMENTS

| 3,652,926 | A  | * | 3/1972  | Brun .......................... 324/304 |
| 6,888,780 | B2 | * | 5/2005  | Happer et al. ................. 368/10 |
| 7,038,450 | B2 |   | 5/2006  | Romalis et al. |
| 7,145,333 | B2 |   | 12/2006 | Romalis et al. |
| 2007/0120563 | A1 | * | 5/2007 | Kawabata et al. ........ 324/244.1 |

* cited by examiner

*Primary Examiner*—Louis M Arana
(74) *Attorney, Agent, or Firm*—Niels Haun, Esq.; Dann Dorfman Herrell & Skillman, PC

(57) ABSTRACT

A radio-frequency tunable atomic magnetometer for detection of nuclear quadrupole resonance (NQR) from room temperature solids, including detection of nitrogen-containing explosives placed external to a sensor unit. A potassium radio-frequency magnetometer with sensitivity of 0.24 $fT/Hz^{1/2}$ operating at 423 kHz is provided. The magnetometer detected a $^{14}N$ NQR signal from room temperature ammonium nitrate ($NH_4NO_3$) in the zero-applied field limit. Results demonstrate first time detection of NQR with an atomic magnetometer, providing that a cryogen-free atomic magnetometer, with intrinsically frequency-independent sensitivity and easy tuning capabilities, can be an attractive new tool for detecting magnetic resonance signals in the kHz to MHz range. Low intensity magnetic fields are measured using an alkali metal vapor, by increasing magnetic polarization of the vapor to increase its sensitivity, then probing the magnetic polarization of the vapor to receive an output, and determining characteristics of the low intensity magnetic field from the output.

20 Claims, 10 Drawing Sheets

SUBFEMTOTESLA RADIO-FREQUENCY ATOMIC MAGNETOMETER FOR NUCLEAR QUADRUPOLE RESONANCE DETECTION

GOVERNMENT RIGHTS

The present invention was made with Government support and the Government has certain rights in the invention.

RELATED APPLICATIONS

This application claims benefit of U.S. Provisional Application Ser. No. 60/732,243, filed Nov. 7, 2005, entitled "Atomic Magnetometer for RF Detection."

FIELD OF THE INVENTION

The present invention relates to a highly sensitive magnetometer having the ability to detect very low magnetic field intensities, and to methods of measuring such low intensity magnetic fields. More particularly, the invention relates to atomic magnetometers that rely on polarizing alkali metal vapor, and probing the state of magnetization of the polarized metal atoms to measure characteristics of a magnetic field originating from a variety of sources, including nitrogen containing explosives placed external to a sensor unit.

BACKGROUND OF THE INVENTION

Over the past several decades ultra-sensitive magnetometers have found a wide range of applications, from condensed matter experiments (Tsuei, C. C. et al., *Phys. Rev. Lett.* 85, 182-185 (2000)) and gravitational wave detection (Harry, G. M. et al., *Appl. Phys. Lett.* 76, 1446-1448 (2000)), to detection of nuclear magnetic resonance (NMR) signals (Greenberg, Ya. S., *Rev. Mod. Phys.* 70, 175-222 (1998); McDermott, R. et al., *Science* 295, 2247-2249 (2002)), studies of paleomagnetism (Kirschvink, J. L. et al., *Science* 275, 1629-1633 (1997)), non-destructive testing (Tralshawala, N. et al., *Appl. Phys. Lett.* 71, 1573-1575 (1997)), and ordinance detection (Clem, T. R., *Nav. Eng. J.* 110, 139-149 (1998)). For the last 30 years superconducting quantum interference devices (SQUIDs) operating at 4K have been unchallenged as ultra-high-sensitivity magnetic field detectors (*SQUID Sensors: Fundamentals, Fabrication and Applications*, Ed. Weinstock, H., Kluwer Academic (1996)) with a sensitivity reaching down to 1 fT/Hz$^{1/2}$ (where fT designates femtotesla, or $10^{-15}$ tesla).

Detection of radio-frequency (RF) fields in the kilohertz to gigahertz frequency range finds numerous applications, from radio communication to detection of NMR and NQR signals to fundamental physics measurements, such as axion searches (Bradley, R. et al., *Rev. Mod. Phys.* 75, 777 (2003)). These applications involve the detection of extremely small fields and thus require the highest attainable sensitivity. While RF fields are usually detected with inductive pick-up coils, several other methods, such as SQUID magnetometers (Black, R. C. et al., *Appl. Phys, Lett.* 66, 1267 (1995); Seton, H. C. et al., *IEEE Trans. Appl. Supercond.* 7, 3213 (1997)) and Rydberg atoms (Ogawa, I. et al., *Ploys. Rev. D* 53, R1740 (1996)) have been used for this purpose. Alkali-metal atomic magnetometers, which measure the response of optically-pumped, polarized atoms to a magnetic field, have achieved very high magnetic field sensitivity at frequencies below 100 Hz (Kominjs, K. et al., *Nature* 422, 596 (2003)), and provide an important alternative to SQUID instruments.

Atomic magnetometers are based on detection of Larmor spin precession of optically pumped atoms. Alkali metal magnetometers have approached sensitivity levels similar to SQUID instruments when using large measurement volumes (Aleksandrov, E. B. et al., Optics and Spectr. 78, 292-298 (1995); Budker, D. et al., Phys. Rev. A 62, 043403 (2000)), but have much lower sensitivity in more compact designs suitable for magnetic imaging applications (Affolderbach, C. et al., Appl Phys B 75, 605-612 (2002)).

Spin exchange in alkali metal vapors has been discussed. Happer W. et al. *Phys. Rev. Lett.* 31, 273 (1973) and Happer W. et al. *Phys. Rev. A* 16 1877 (1977) report experimental and theoretical aspects of observing magnetic resonance in high density alkali metal vapors in the presence of a buffer gas. U.S. Pat. No. 4,005,355 to Happer et al. discloses a high-density alkali vapor optically pumped to produce a narrow magnetic resonance line with a frequency proportional to a magnetic field.

Bison et al. (a) (Appl. Phys. B. 76, 325 (2003) and Bison et al. (b) (Opt. Expr. 11, 908 (2003)) disclose an optically pumped cesium atom magnetometer for use in dynamic cardiac magnetic imaging. Observed magnetic noise levels in Bison et al. (b) appear to be on the order of 1000 fT/Hz$^{1/2}$.

Upschulte et al. (U.S. Pat. No. 6,472,869) discloses a diode laser-pumped alkali magnetometer. In Upschulte et al., response radiation includes photons that indicate one unit of angular momentum indicative of the torque due to the magnetic field, and a photodiode and scope that act as a means for measuring the response radiation. Upschulte et al. disclose a projected sensitivity of less than 6 pT/Hz$^{1/2}$ (pT=picotesla or $10^{-12}$ tesla).

In view of the disadvantages of relatively poor sensitivity, and drawbacks such as large bulk and use of cryogenic systems summarized above, there remains a need for a magnetometer that can operate in the absence of expensive liquid helium dewars needed to maintain superconducting conditions, and also to avoid the need for other liquefied gas dewars used with higher temperature superconducting devices. In addition there remains a need for the development of advantageous atomic magnetometers with high sensitivity. There further is a need for a compact magnetometer that is relatively inexpensive to assemble and operate.

SUMMARY OF THE INVENTION

The present invention provides a high sensitivity, cryogenic free, atomic magnetometer including a cell with alkali-metal vapor and two laser beams (pump and probe). The pump laser creates spin polarization in atoms. A constant magnetic field is applied parallel to the pump laser. The Zeeman resonance of the alkali-atoms is tuned to the frequency of the radio-frequency (RF) field. The precession of the spins induced by the RF field is detected with the probe laser orthogonal to the pump laser.

In a first aspect of the invention, an atomic magnetometer is provided that detects and represents a first magnetic field originating within a sample volume, and includes a sensing cell sensitive to high intensity magnetic fields comprising an alkali metal vapor. The sensing cell is adjacent to a sample volume that includes a component generating a first magnetic field, and is exposed to the first magnetic field and a background magnetic field to tune and maintain magnetometer operation at high frequency. The magnetometer also includes a polarizing transmitter that increases a magnetic polarization of the alkali metal vapor, a magnetizer that imposes the background and a second magnetic field on a volume of space comprising the sensing cell, a probing interrogator that probes the magnetic polarization of the alkali metal vapor and provides an output from the alkali metal vapor that includes characteristics related to the first magnetic field. Lastly, the magnetometer includes a measuring module that receives the output, determines the characteristics of the first magnetic field, and provides a representation of the first magnetic field. High frequency of magnetometer operation is defined as at or above approximately 1 kHz. In other aspects, high frequency can be defined as at or above about 100 kHz.

In certain embodiments, the second magnetic field can comprise a pulsed detuning field that offsets a magnetic resonance frequency of the alkali metal vapor, including but not limited to offset to about 2 MHz. The magnetizer can include excitation coils comprising a solenoidal RF coil in series with a planar coil in a vicinity of the first magnetic field. The series or "single sided" design provides that the planar coil cancels a RF field generated by the solenoidal RF coil in the vicinity of the first magnetic field.

In advantageous embodiments the polarizing transmitter is an optical pumping laser, and a half-width at half-maximum of a Zeeman resonance of the alkali metal vapor as provided by the optical pumping laser is a function of a power of the laser. The power of the laser is selected from the functional curve to provide a minimal half-width at half-maximum of the Zeeman resonance of the alkali metal vapor.

In another aspect of the present invention, a method is provided for detecting and representing a low intensity magnetic field in the radio-frequency (RF) range using an atomic magnetometer with sensing cell having a high sensitivity to the low intensity magnetic field. The method comprises the steps of increasing magnetic polarization of alkali metal vapor included in the sensing cell to tune a Zeeman resonance of the alkali metal vapor to high frequency to increase the sensitivity of the alkali metal vapor to the low intensity magnetic field and reorienting the magnetic polarization of the alkali metal vapor using a magnetic field. Then, the magnetic polarization of the reoriented alkali metal vapor is interrogated to provide an output having characteristics related to the low intensity magnetic field. Characteristics of the low intensity magnetic field are determined from the output, and a representation of the characteristics of the low intensity magnetic field are provided. Again, in certain aspects, high frequency is defined as at or above approximately 1 kHz, and in other aspects, at or above about 100 kHz.

In advantageous embodiments, the magnetic polarization of the alkali metal vapor is reoriented by illumination in opposite directions of a similar plane. Magnetic polarization can be further reoriented using a pulsed detuning magnetic field that offsets the magnetic resonance frequency of the alkali metal vapor. Still further, the magnetic polarization of the alkali metal vapor can be reoriented using a laser, where a half-width at half-maximum of the Zeeman resonance of the alkali metal vapor, as provided by the laser, is a function of a power of the laser. The power of the laser is then selected from the functional curve to provide a minimal half-width at half-maximum. In any combination of the above, the magnetic polarization of the alkali metal vapor can still further be reoriented using excitation coils comprising a solenoidal RF coil in series with a planar coil in a vicinity of the low intensity magnetic field. In this instance, the planar coil cancels a RF field generated by the solenoidal RF coil in the vicinity of the low intensity magnetic field.

In certain embodiments, the atomic magnetometer includes magnetic shielding enclosing a region of space that includes the magnetizer, the sample volume, and the sensing cell. The shielding and the magnetizer contribute to providing the background magnetic field. The density of the alkali metal in the vapor can be about $10^{11}$ cm$^{-3}$ or greater. The alkali metal can be chosen from among sodium, potassium, rubidium and cesium. Potassium is often preferable. The sensing cell is maintained at a temperature effective to provide an alkali metal vapor at a density greater than about $10^{11}$ cm$^{-3}$.

In advantageous embodiments, the buffer gas includes a noble gas. The buffer gas may include one or more isotopes of helium, and is included at a pressure in the range from about 1 atm to about 10 atm. Significantly, the buffer gas may further include nitrogen gas, or it maybe constituted solely of nitrogen gas. Factors such as the temperature and consequent density of the vapor, and the presence and composition of the buffer gas contribute to providing that a sensitivity limit of the present magnetometer is about 0.20 femtotesla (Hz)$^{-1/2}$ to 0.10 femtotesla (Hz)$^{-1/2}$, or even as low as 0.02 femtotesla (Hz)$^{-1/2}$, and perhaps lower.

In example realizations of the invention, a means for increasing the magnetic polarization of the alkali metal vapor (or polarizing transmitter) includes a first radiation generating means that generates a first beam of radiation illuminating the alkali metal vapor. The first beam is effective to increase the magnetic polarization of the alkali metal vapor. The first radiation generating means can include a first laser device, or can further include a first optical polarizing means that polarizes the first beam of radiation. The first optical polarizing means may impose linear polarization on the first beam of radiation, or, alternatively, it may impose circular polarization on the first beam of radiation. A first modulator could also be included to modulate the first beam of radiation by a first modulation function.

In other example realizations, a probing means (or probing interrogator) includes one or more second radiation generating means that generates one or more second beams of radiation traversing the alkali metal vapor; after the one or more second beams traverse the vapor they constitute the output of the magnetometer. The second radiation generating means can include a second laser device, or can further include a second optical polarizing means that polarizes the second beam of radiation. The second optical polarizing means may impose linear polarization on the second beam of radiation, or, alternatively, it may impose circular polarization on the second beam of radiation. Still additionally, a second modulator can be included that modulates the second beam of radiation by a second modulation function.

Other example realizations provide that a magnetizing means (or magnetizer) provides a probing magnetic field in one, two, or all three of the orthogonal directions, x, y, and/or z. In addition, the magnetizer can provide a probing magnetic field modulated by a third modulation function.

A measuring module, or measuring means, can include one or more output detecting means that provides one or more signals. The one or more signals contain characteristics related to the low intensity magnetic field. The measuring means also includes one or more signal processing means for receiving the one or more signals and providing the representation. The output detecting means can include radiation detecting means that detects a second beam of radiation output from the alkali metal vapor. Alternatively, a third optical polarizing means is situated between the sensing cell and the radiation detecting means. The third optical polarizing means may include a linear polarization analyzer, or it may include a circular polarization analyzer.

In certain embodiments, the radiation detecting means includes one or more photodetectors, each photodetector providing a signal that contains characteristics related to the low intensity magnetic field. When a first modulation function or second modulation function is employed, the signal advantageously includes a component modulated by the first modulation function or the second modulation function, or both.

The signal processing means can receive at least a portion of a signal from the output detecting means. The signal processing means operates to resolve characteristics related to the low intensity magnetic field from the signal and provides a representation thereof, such that the representation characterizes the low intensity magnetic field detected by the sensing cell. When the signal is modulated by a first modulation function or a second modulation function, or both, the signal processing means detects a component in the signal that is modulated by the first modulation function or the second modulation function, or both.

The measuring means can include two or more output detecting means, wherein a first output detecting means detects radiation traversing a first region of the alkali metal vapor and a second output detecting means detects radiation traversing a second, different, region of the alkali metal vapor. In these embodiments, the first output detecting means provides a signal to a first signal processing means and the second output detecting means provides a signal to a second signal processing means; the first signal processing means provides a representation of the low intensity magnetic field sensed in the first region and the second signal processing means provides a representation of the low intensity magnetic field sensed in the second region.

Example realizations of the invention provide a representation of a source of a first magnetic field occurring within the sample volume displayed in one of three orthogonal Cartesian coordinates, or in two of three orthogonal Cartesian coordinates, or in three of three orthogonal Cartesian coordinates, referenced to the sample volume.

BRIEF DESCRIPTION OF THE DRAWINGS

For the purpose of illustrating the invention, there is shown in the drawing(s) a form that is presently preferred; it being understood, however, that this invention is not limited to the precise arrangements and instrumentalities shown.

DETAILED DESCRIPTION OF ILLUSTRATIVE EMBODIMENTS

Figure 1:
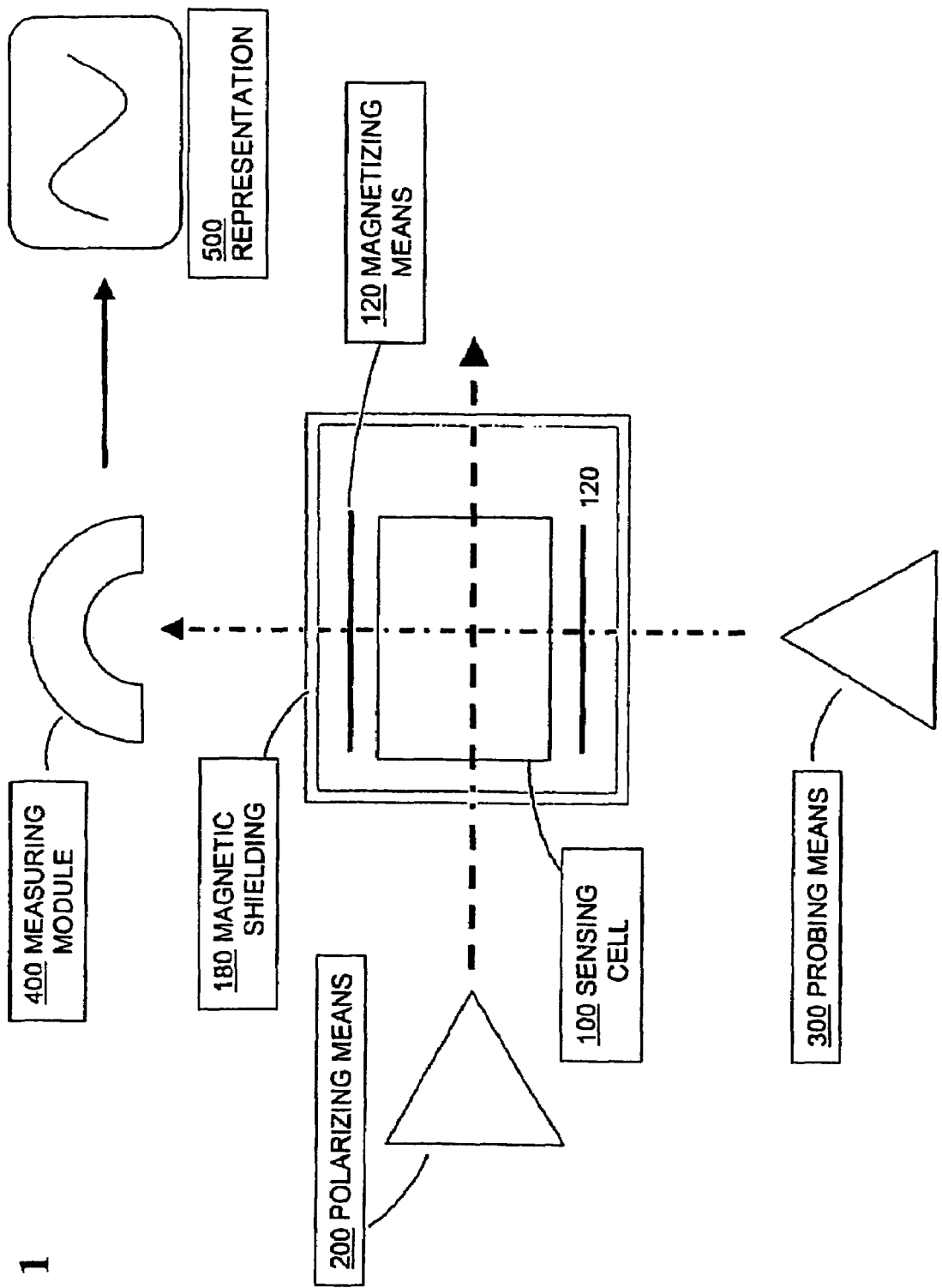
FIG. 1 is a schematic diagram of several components employed in an embodiment of an atomic magnetometer of the invention.

As used herein, the term "magnetic polarization", and similar terms and phrases, relate to the spin polarization of an ensemble of atoms having a nonzero quantum number, such as a nonzero orbital angular momentum quantum number, or a nonzero electron spin quantum number, or a nonzero nuclear spin quantum number, or any combination thereof. An ensemble having nonzero spin responds to a magnetic field. Furthermore, the state of polarization is changed in response to changes in the magnetic field imposed on the ensemble.

The term "characteristics" and similar terms and phrases are used to relate a) to a source of a magnetic field; b) to the properties of such a magnetic field in a region of space in which other sources of magnetization are also present; c) to the magnetic polarization of an ensemble of atoms sensitive to magnetic field originating from the source even when other sources of magnetization are also present; d) to the altered properties of a probing modality wherein the alteration reflects the effects of the magnetization sensed by the ensemble of atoms and including the effects of the magnetic field originating from the source; e) to the properties of a signal generated by such an altered probing modality wherein the signal includes the effects of the magnetization sensed by the ensemble of atoms and including the effects of the magnetic field originating from the source; and f) to a representation of the magnetic signal originating from the source after the effects of all other sources of magnetization have been removed or minimized. Characteristics include properties relating to the magnetic field originating from the source including, by way of nonlimiting example, spatial, temporal, amplitudinal, vectorial and similar properties of a source magnetic field. Thus the phrase "characteristics related to a magnetic field" and similar phrases, as used herein, is intended to convey that characteristics of a source of a magnetic field, the properties of a magnetic field, the magnetic polarization of atoms, or characteristics of a probing modality, or characteristics of a signal, or characteristics of a representation, include information related to properties such as those exemplified above.

The term "output" and similar terms or phrases relate to a probe modality that has traversed a sensing cell of the invention and whose properties have been altered by traversing the alkali metal vapor contained in the cell. The output probe modality, for example an output beam of probe radiation, includes characteristics of the magnetic polarization of the alkali metal vapor.

The term "representation", and similar terms and phrases, relate to any verbal, numerical, tabular, graphical or multidimensional display conveying information about, especially characteristics related to, a measured magnetic field strength provided by the atomic magnetometer of the invention. Thus, a representation may be as elementary as a single number or a verbal equivalent of such a number. Alternatively, a representation may be a set of numbers describing different aspects of the information related to the measured magnetic field strength. Such a set of numbers may be displayed, by way of nonlimiting example, as a vector, or as a matrix, or as a table. A representation may further include a graphical display providing a visual or pictorial image of the results of measurements of the magnetic field strength provided by the atomic magnetometer of the invention. In yet another example of a representation, additional dimensions portraying one, two, or three-dimensional spatial images, as well as yet a different additional dimension representing time may be included in a representation. Any equivalent means of representing the results of the measurements of magnetic field strength provided by the atomic magnetometer of the invention is understood to be within the scope of the term "representation".

The term "noble gas" and similar terms and expressions relate to any isotope of helium, neon, argon, krypton, xenon or radon. In addition, any mixture of noble gases is included by usage of "noble gas".

Lastly, as used herein, the term "optical polarization" and similar terms and phrases relate specifically to optical radiation and are distinguished from "magnetic polarization" and similar terms. "Optical polarization" relates to the state of polarization of the wave aspect of radiation as it propagates. Optical polarization may synonymously be characterized as linearly polarized or plane polarized, wherein a wave describing the radiation is thought to vibrate in a single plane. Optical polarization characterized as circularly polarized relates to vibration of a wave of radiation that describes a helix as it propagates; the projection of the helix on to a plane perpendicular to the direction of propagation describes a circle. The helix may have a left handed sense of rotation as it propagates or it may have a right handed sense of rotation.

The present invention provides an atomic magnetometer of compact size and high sensitivity. The invention additionally provides methods of determining magnetic field strengths, their time dependence, and their spatial distribution with convenience, versatility and great sensitivity. Because of these and other attributes described herein, the invention provides distinct advantages with respect to atomic magnetometers already available in the field.

One important attribute of the magnetometer is that the magnetic field sensing substance, an alkali metal vapor, is used at relatively high number density. This has the beneficial effect of increasing the concentration of sensing atoms present per unit volume. Additionally, a buffer gas, such as a noble gas, is used to slow the rate at which atoms hit a wall. In addition, nitrogen gas at a moderate partial pressure is also included to quench the optical transitions. Certain combinations of alkali metal-noble gas mixtures offer more advantageous slowing of collision spin relaxation than others. Additionally, the buffer gas slows diffusion of the alkali metal atoms, allowing independent measurement of the magnetic field in several adjacent regions of the cell. In addition, the buffer gas broadens the optical resonance lines of the atoms, allowing one to use low-cost broadband lasers and eliminating the need for precise stabilization of the laser frequency.

One advantage of the present magnetometer is that, as a consequence of its increased sensitivity, the overall dimensions of a cell containing the alkali metal vapor mixture is considerably reduced. This has the advantage of conferring convenience, greater portability, and greater versatility in obtaining measurements on various subjects or objects.

As illustrated in FIG. 1, the present invention provides a high sensitivity atomic magnetometer that includes several important components. A sensing cell 100 is an enclosure containing a mixture that becomes magnetically sensitive upon operation of the apparatus. The sensing cell contains a mixture of an alkali metal vapor that is sensitive to a low intensity magnetic field, a buffer gas, and may additionally contain a quenching gas component. The alkali metal vapor is provided from a reservoir of the metal introduced as a solid upon fabrication of the cell. The sensitivity of the magnetometer is advantageously enhanced by operation at a high density of the alkali metal; this is achieved by heating the sensing cell to a temperature that provides a relatively high partial pressure of the alkali metal in the vapor. In various embodiments, the number density of the alkali metal atoms in the vapor may about $10^{11}$ cm$^{-3}$ or greater, or about $10^{12}$ cm$^{-3}$ or greater, or about $10^{13}$ cm$^{-3}$ or greater, or about $5 \times 10^{13}$ cm$^{-3}$ or greater, or about $10^{14}$ cm$^{-3}$ or greater, or about $5 \times 10^{14}$ cm$^{-3}$ or even greater. In example realizations, the alkali metal density is sufficiently high that the maximum deviation of the magnetic field from zero times $\mu/h$, where $\mu$ is the magnetic dipole moment, and h is Planck's constant, is much less than the spin exchange rate.

The sensing cell 100 is maintained in a high frequency environment (i.e., an environment at or exceeding 0 kHz, or sometimes 100 kHz). Background magnetic fields are used to tune and maintain the magnetometer to the specific high frequency desired by applying bias fields using a magnetizer, or magnetizing means, 120 as shown in FIG. 1 and described more fully below. The magnetizer 120 also counters any residual environmental fields reaching the sensing cell 100. For example, a feedback system may be used to adjust the necessary magnetic field, such as a feedback using a signal generated by an output detecting means.

In order to provide such high vapor densities of the alkali metal the sensing cell is maintained at an elevated temperature effective to provide an alkali metal vapor. In various embodiments the alkali metal may be chosen from among sodium, potassium, rubidium and cesium; in a particularly significant embodiment the alkali metal is potassium.

The sensing cell employed in the atomic magnetometer also contains a buffer gas. Components of the buffer gas are chemically unreactive with the alkali metal atoms in the vapor. In certain embodiments, the buffer gas includes a noble gas, such as helium, neon, argon, xenon or krypton. In other embodiments, the buffer gas contains one or more isotopes of helium (i.e., $^3$He or $^4$He). The buffer gas is included at relatively high pressure. Relative high pressure of the buffer gas has the beneficial effects of shortening the diffusion path of the alkali metal, thereby enhancing the spatial resolution of the magnetometer. Advantageously, the pressure of the buffer gas may be about 1 atm or greater, or 2 atm or greater, or 3 atm or greater, or 5 atm or greater, or 8 atm or greater, or even 10 atm or greater. In addition, the buffer gas may also include a quenching component, such as nitrogen gas. When present, the nitrogen gas may be included at a partial pressure of about 10 torr or greater, or about 30 torr or greater, or about 60 torr or greater, or about 100 torr or greater, or even about 200 torr or greater. Furthermore, the buffer gas may be constituted solely of nitrogen gas, in which case its pressure may range as high as 10 atm. In general, the pressure of the buffer gas is sufficient to slow the diffusion of the alkali metal atoms to the walls of the sensing cell, thus achieving long spin relaxation time. Any equivalent buffer gas is contemplated to be within the scope of the invention.

The sensing cell may be fabricated of any material compatible with the requirements of the apparatus; for example, the material must be inert with respect to the reactive alkali metal vapor, and must sustain the physical stress of high pressure of the buffer gas. As seen below, in many embodiments of the magnetometer the sensing cell transmits optical radiation through it; thus the sensing cell must be transparent to the radiation used and have windows that transmit beams of radiation without loss or distortion. In addition the sensing cell must be maintained at elevated temperature to volatilize the alkali metal atoms. The sensitivity of the magnetometer is related to the number of magnetic field sensing atoms employed. Thus, in addition to increasing the number density of alkali metal atoms by raising the temperature, their number may also be increased by employing a larger sensing cell. This advantage is offset by the desire of the present inventors to keep the overall dimensions of the magnetometer as compact as possible. As employed in the present invention, the enclosed volume of the sensing cell may be about 300 $cm^3$ or less, or about 200 $cm^3$ or less, or about 100 $cm^3$ or less, or about 75 $cm^3$ or less, or about 40 $cm^3$ or less, or about 25 $cm^3$ or less, or about 10 $cm^3$ or less, about 5 $cm^3$ or less.

The magnetometer includes a polarizing transmitter, as a means for increasing the magnetic polarization of the alkali metal vapor contained in the sensing cell (FIG. 1, 200). This serves to increase the sensitivity of the alkali metal vapor to a low intensity magnetic field impinging upon the sensing cell 100. In general, magnetic polarization in the alkali metal vapor may be increased by transmitting into the vapor any form of energy that includes a strong magnetic component. The present invention contemplates any means for transmitting such magnetic energy into the sensing cell, including, by way of nonlimiting example, electromagnetic radiation, focused or oriented magnetic fields, and any equivalent means that effectively increases the magnetic polarization of the alkali metal atoms. The heavy dashed line projecting from the means for increasing the magnetic polarization of the alkali metal vapor 200, to and in general through, the sensing cell 100 portrayed in FIG. 1 is intended to indicate that the polarizing transmitter 200, although separate from the sensing cell 100, nevertheless projects the energy for increasing the magnetic polarization of the alkali metal vapor into the vapor.

Figure 2:
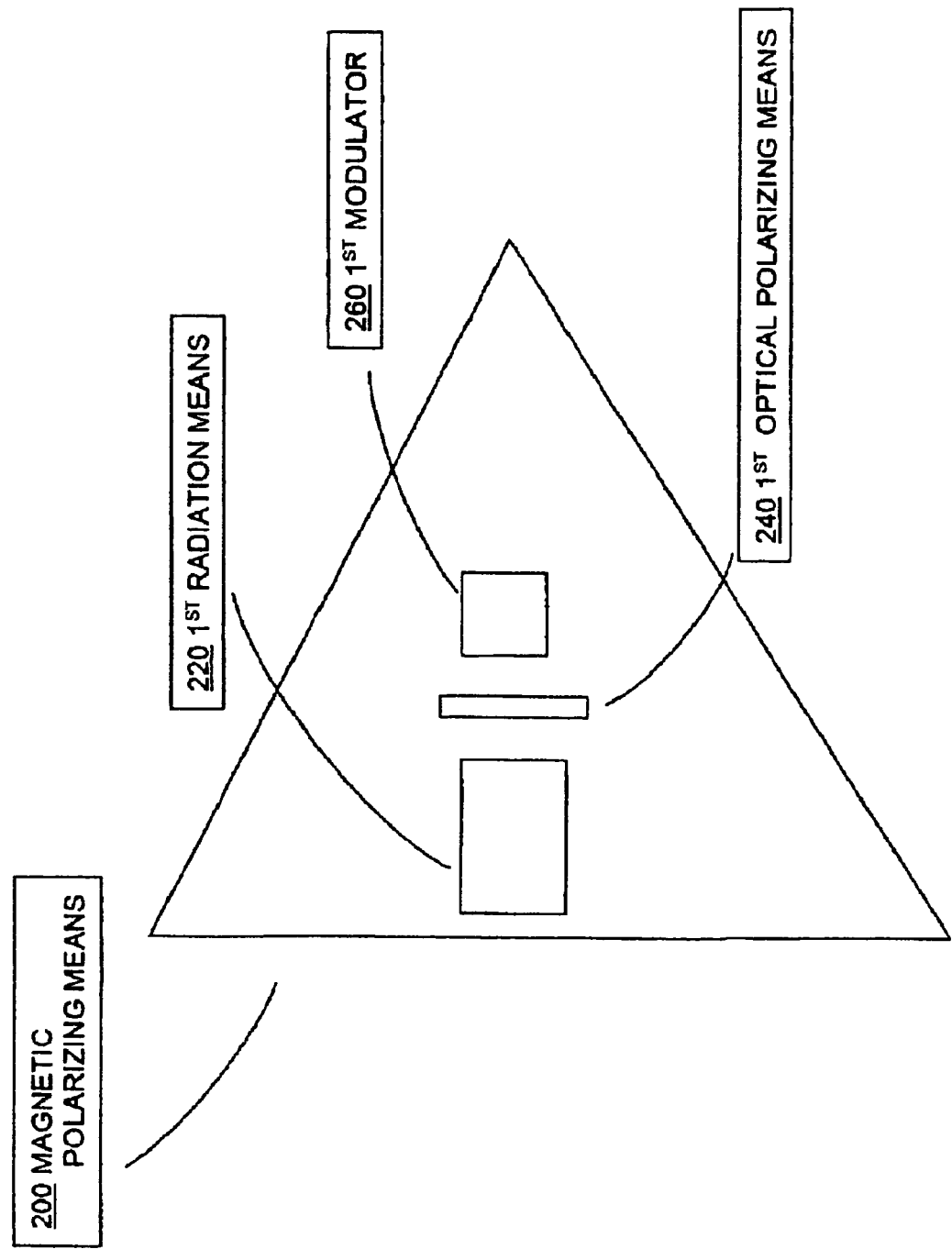
FIG. 2 is a schematic diagram of several components employed in an embodiment of a means for increasing the magnetic polarization of an alkali metal vapor.

An important embodiment of the means for increasing the magnetic polarization of the alkali metal vapor 200 is exemplified in FIG. 2, which shows the polarizing transmitter 200 in an expanded view. Encompassed within it is a first radiation generating means 220 that generates a first beam of radiation that is projected such that it illuminates the sensing cell and the alkali metal vapor contained within it. The energy of the first beam of radiation is sufficient effectively to increase the magnetic polarization of the alkali metal vapor. The first radiation generating means can include a first laser device. The attributes of the first laser device are such that it generates a beam of radiation whose radiation frequency and intensity are effective to increase the magnetic polarization of the alkali metal vapor. In order to attain a significant increase in the magnetic polarization of the alkali metal vapor, the first laser device is typically a high power laser whose radiation may be continuous or may be generated in pulses. The high power laser is frequently called an optical pumping laser, whose effect is to spin-polarize the alkali metal ions. Magnetization is commonly described in terms of components oriented along the orthogonal three Cartesian directions. As described herein and illustrated in the figures, the direction of propagation of the first beam of radiation impinging upon the sensing cell is designated the z direction.

The performance of the present magnetometer is enhanced when the total rate of optical pumping and spin relaxation is greater than the bandwidth of signals to be detected. Additionally, the magnetometer is beneficially operated when the total rate of optical pumping and spin relaxation is greater than the deviation of the magnetic field from zero times µ/h. When the pressure of the buffer gas is sufficient the high power laser for the optical pumping may be a broadband diode laser.

In this embodiment, the polarizing transmitter 200 further includes a first optical polarizing means 240 (FIG. 2) that polarizes the first beam of radiation. In various embodiments, first optical polarizing means provides linearly polarized radiation, or circularly polarized radiation, which may be left circularly polarized, right circularly polarized, or may alternate between left and right circular polarization. In addition, in certain other embodiments, the means for increasing the magnetic polarization of the alkali metal vapor 200 further optionally includes a first modulator 260 (FIG. 2) that modulates the first beam of radiation by a first modulation function. Such modulation, when employed, advantageously enhances the sensitivity of detection. Furthermore, different modulation functions may be applied to different parts of the polarizing beam. In this method, different regions of the sensing cell experience different modulation conditions of the polarizing beam. These differences can be detected by the probe beam and be used to uniquely identify magnetic signals coming from different regions of the cell. In certain embodiments, a component that operates both to polarize the first beam of radiation and to modulate it may be incorporated into a single physical entity. In certain embodiments, the pump beam used to increase the magnetic polarization of the alkali metal vapor is tuned on resonance with the absorption of the vapor and is circularly polarized.

In general, any equivalent item of apparatus operating to project energy onto the alkali metal atoms of the sensing cell to increase magnetic polarization is encompassed within the scope of the polarizing transmitter 200. Such modalities are known to workers of skill in fields related to the present invention, including by way of nonlimiting example, physicists, optical engineers, electrical engineers, and the like.

The magnetometer also includes a probing interrogator, as a means for probing the magnetic polarization of the alkali metal vapor 300 (FIG. 1). The probing interrogator 300 interrogates the magnetic polarization of the vapor; the magnetic polarization in general includes a contribution resulting from the effect on the alkali metal atoms of a low intensity magnetic field intended to be measured by the atomic magnetometer. In this way the probing interrogator induces the provision of an output that includes characteristics related to the low intensity magnetic field that the magnetometer is intended to measure. The output is provided after the probing means has interrogated the vapor.

Figure 3:
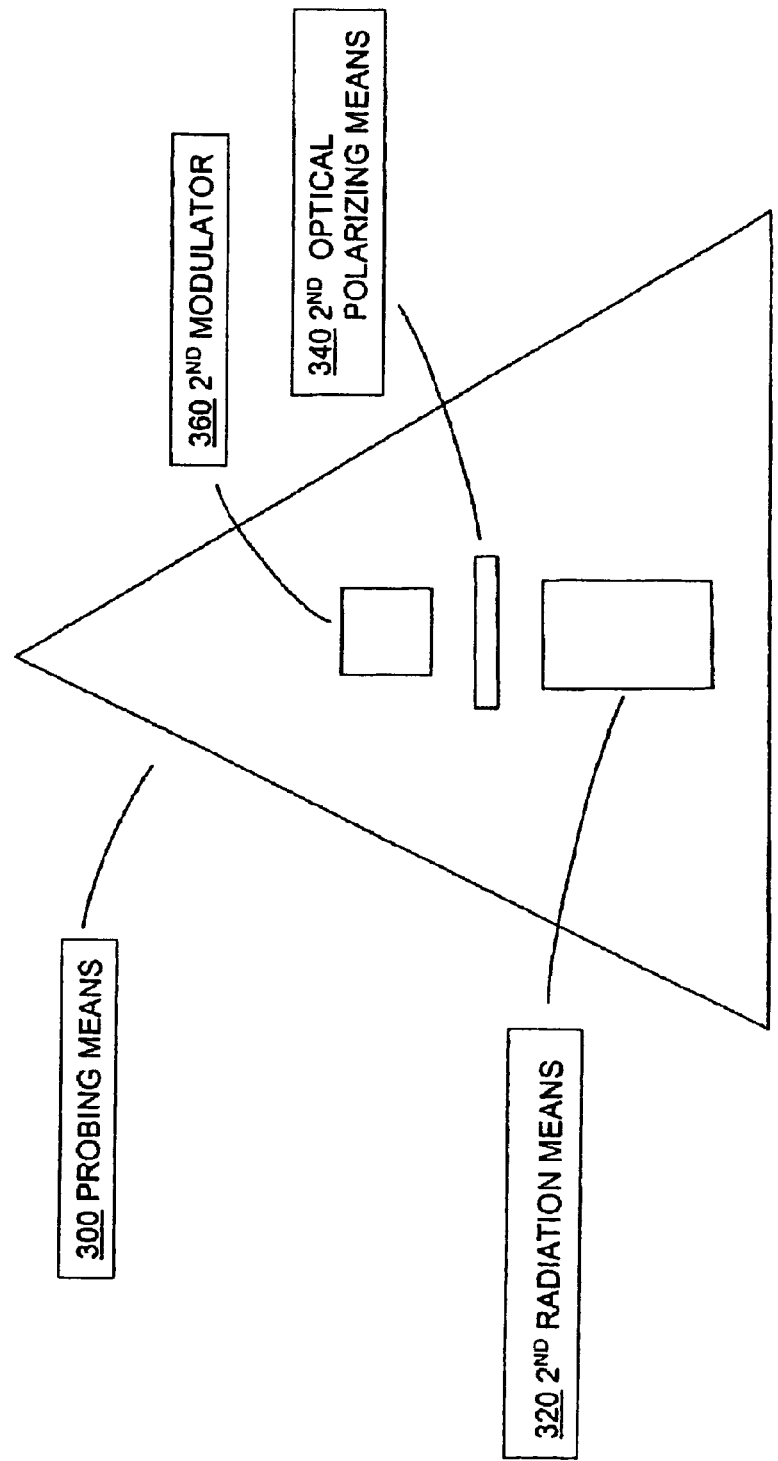
FIG. 3 is a schematic diagram of several components employed in an embodiment of a means for probing the magnetic polarization of an alkali metal vapor.

An embodiment of the probing interrogator 300 is further exemplified in FIG. 3. This embodiment includes a second radiation generating means 320 that generates a second beam of radiation traversing the alkali metal vapor. The second radiation generating means can include a second laser. The frequency and intensity of the second beam of radiation is effective to interrogate the magnetic polarization of the alkali metal vapor without affecting the magnetic polarization significantly. In particular, its frequency differs from that of the first beam of radiation, being detuned from the resonance frequency of the vapor, sufficiently that no absorption occurs. In embodiments of the magnetometer employing Cartesian coordinates for description, the second beam of radiation impinges on and traverses the sensing cell in the x direction; additional second beams, polarized and modulated as described below, may impinge in other directions of the Cartesian coordinate domain.

In certain embodiments, the probing means 300 further includes a second optical polarizing means 340. The second optical polarizing means 340 provides linearly polarized radiation, or circularly polarized radiation, which may be left circularly polarized, right circularly polarized, or may alternate between the two states. In addition, in certain other embodiments, the means for probing the magnetic polarization of the alkali metal vapor 300 further includes a second modulator 360 (FIG. 3) that modulates the second beam of radiation by a second modulation function. The second modulator advantageously serves to enhance the sensitivity of detection. When the pressure of the buffer gas in the sensing cell is sufficient, the laser used for probing the magnetization of the alkali metal atoms may be a broadband diode laser. The probe beam can be tuned off resonance from the absorption of the alkali vapor, and can be linearly polarized.

The output of the probing interrogator 300 is found after interrogation has traversed the sensing cell. In the embodiments described in the preceding paragraphs the output is constituted by at least the second beam of radiation after it exits the sensing cell. Its characteristic properties have been altered as a consequence of traversing the alkali metal vapor in a way that can be detected by appropriate means.

In general, an atomic magnetometer of the present invention includes a means for probing the magnetic polarization of the alkali metal vapor 300, or in significant embodiments it may include a plurality of means for probing the magnetic polarization of the alkali metal vapor, each of which is generally described as set forth above for a probing interrogator 300. In the latter embodiments each means for probing the magnetic polarization of the alkali metal vapor 300 may project its probing energy on to the same sensing cell, or each separately may project its probing energy on to a separate sensing cell. Likewise, in embodiments having a plurality of means for probing the magnetic polarization of the alkali metal vapor 300, each such means directs its probing energy on to a separate measuring module 400 (see below).

In general, any equivalent item of apparatus operating to project energy onto the alkali metal atoms of the sensing cell to interrogate magnetic polarization are encompassed within the scope of the probing transmitter 300. Such assemblies of apparatus are known to workers of skill in fields related to the present invention, including by way of nonlimiting example, physicists, optical engineers, electrical engineers, and the like.

The magnetometer also includes a magnetizer, as a magnetizing means 120 (FIG. 1) for imposing a probing magnetic field on a volume of space that includes the sensing cell. The probing magnetic field affects the magnetic polarization of the alkali metal vapor contained in the sensing cell and confers attributes thereon that contribute to the interrogation of the probing means. In many embodiments, the magnetizer include induction coils through which an electrical current flows, thereby generating the probing magnetic field. In general, the magnetizer 120 includes components oriented such that the probing magnetic field is provided in one, two, or all three of the orthogonal directions, x, y, and/or z. In this way, all three components of the low intensity magnetic field vector being measured may be determined. Furthermore, in accomplishing this objective, the magnetizer 120 may be driven by a third modulation function. As already indicated, as a result of the probing magnetic field present in the sensing cell, at least one property of the second beam of radiation is modulated as it traverses the alkali metal vapor experiencing the probing magnetic field. In addition, the magnetizer 120 provides bias magnetic fields to the sensing cell that: 1) nullify residual background magnetic fields from the environment; and 2) tune and maintain magnetometer operation at high frequency.

The sensitivity of the atomic magnetometer described herein is extremely high. For this reason, all components of the magnetometer sensitive to magnetic fields must be effectively isolated from extraneous magnetic fields. Accordingly, a region of space that includes the sensing cell 100, the magnetizing means 120, and a region in which it may be intended to measure the magnetic field is enclosed in magnetic shielding 180 (FIG. 1). The magnetic shielding 180 may be constructed of any of the widely known magnetic shielding substances, including by way of nonlimiting example, magnetic shielding tape, Mollypermalloy, and $\mu$ metal. In addition magnetic shielding can include superconducting shields, which eliminate a Johnson noise component. The shielding is fabricated to allow the means for increasing the magnetic polarization of the alkali metal vapor and the means for probing the magnetic polarization of the alkali metal vapor to access the sensing cell and impinge upon it. Effective shielding and neutralization of background fields by the magnetizing means contribute to the enhanced sensitivity of the magnetometer of the present invention.

Any equivalent means of effectively shielding the region of space from extraneous magnetic fields is encompassed within the scope of the invention. Such equivalents are known in fields related to the present invention, including by way of nonlimiting example, physicists, optical engineers, electrical engineers, and the like.

Figure 4:
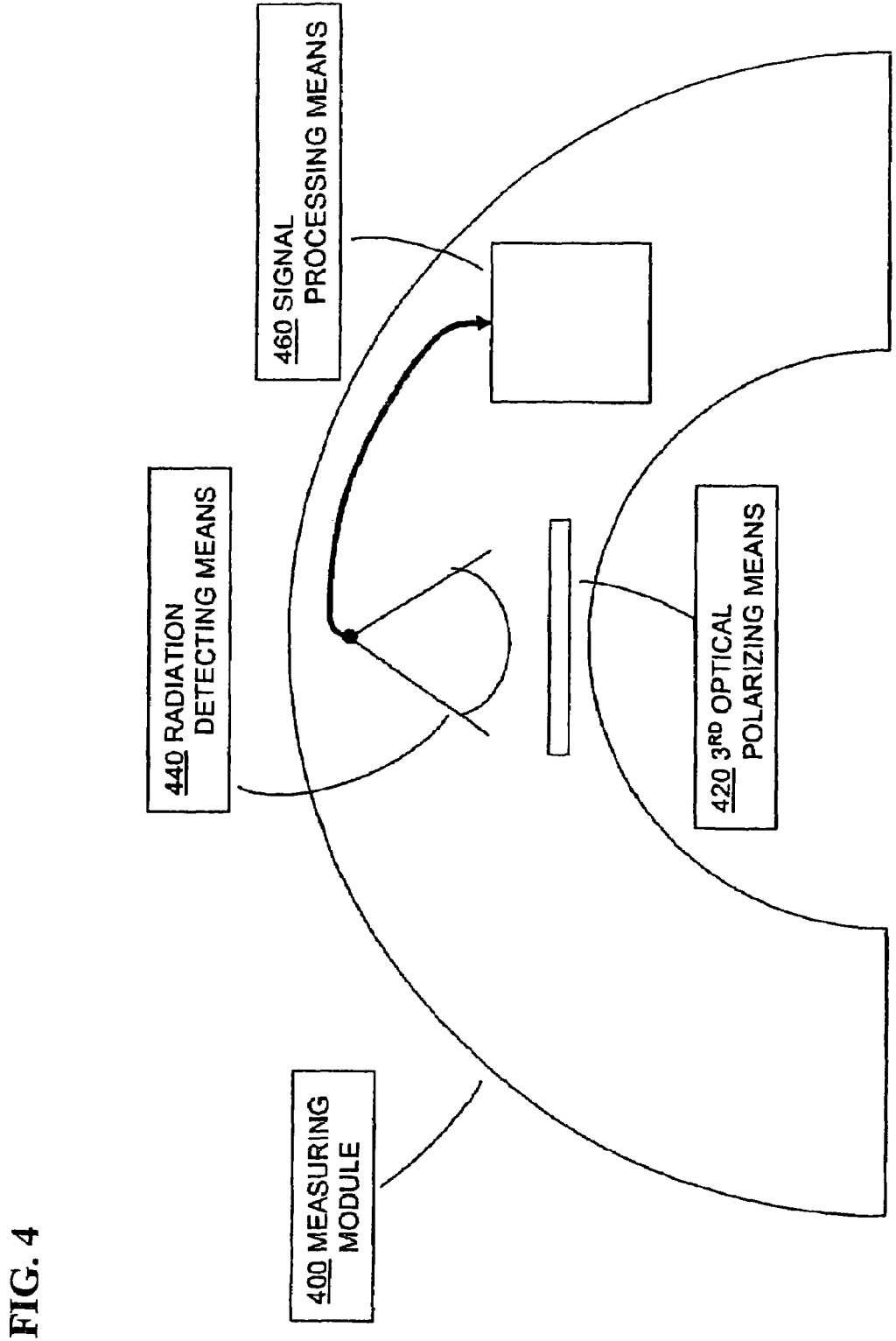
FIG. 4 is a schematic diagram of several components employed in an embodiment of a measuring module.

The atomic magnetometer additionally includes a measuring module 400 (FIG. 4). The measuring module is a means for receiving the output after it is provided from the sensing cell 100, for determining the characteristics of the low intensity magnetic field that are comprised in the output, and providing a representation characterizing the low intensity magnetic field detected by the sensing cell. In important embodiments the measuring module includes an output detecting means 440 (see FIG. 4) that provides a signal including characteristics related to the low intensity magnetic field, and signal processing means 460 for receiving the signal from the output detecting means 440 and providing the representation. Thus, in general, the output detecting means communicates with the signal processing means, such as is shown schematically by the heavy curved arrow in FIG. 4.

In those embodiments of the invention in which the probing interrogator 300 includes a second radiation generating means 320 that generates a second beam of radiation traversing the alkali metal vapor, the output detecting means 440 includes a means for detecting radiation, such as the output of the second beam of radiation after the beam traverses the alkali metal vapor. Nonlimiting examples of radiation detecting means include a photometer, a photomultiplier, a photodiode or a photodiode array, a charge-coupled detector, a multichannel analyzer or array, and the like. In embodiments where a multiplexed detector such as a photodiode array or a multichannel analyzer or array is used, each detector in the array detects an output originating from a different region in the sensing cell. For optimal performance of a magnetometer employing multiplexed detectors in this way the pressure of the buffer gas is sufficient to limit diffusion of the alkali metal atoms between regions that provide outputs to different elements in the detector array.

Any equivalent means for detecting an output of the invention, including but not limited to equivalents for detecting radiation, are included within the scope of the measuring module. Such equivalent detecting means are well known to workers of skill in fields related to the present invention, including by way of nonlimiting example, physicists, optical engineers, electrical engineers, and the like.

As noted above, many embodiments of the invention include means for probing the magnetic polarization of the alkali metal vapor 300 that also includes a second optical polarizing means 340. These may variously provide linearly polarized radiation, or circularly polarized radiation, which may be left circularly polarized, right circularly polarized, or may alternate between the two states. In such embodiments, the measuring module 400 also includes a third optical polarizing means 420 (FIG. 4) interposed between the sensing cell and the radiation detecting means 440. In important examples, the third optical polarizing means may include a linear polarization analyzer or a circular polarization analyzer. Such analyzers are axially oriented to be at or near an extinction angle when there is no low intensity magnetic field that is to be measured impinging upon the sensing cell. In this way, the output detecting means is primed to detect a small amount of radiation different from zero, that includes characteristics of the low intensity magnetic field, to which it should be especially sensitive.

The radiation detecting means converts the output impinging upon it to a signal that includes components whose characteristics are related to the properties of the low intensity magnetic field. Such properties include, by way of nonlimiting example, spatial, temporal, amplitudinal, vectorial and similar properties it may be endowed with. The magnitude and time dependence are readily apparent in the characteristics of the signal in real time. In certain embodiments, the vector components become apparent upon varying the imposition of a probing magnetic field by the magnetizer 120 among the x, y, and z directions upon the sensing cell, and comparing the results obtained in the various cases.

The signal provided by the output detecting means, or at least a portion thereof, is input to the signal processing means 460. The signal processing means resolves characteristics related to the low intensity magnetic field from the signal and provides a representation attributes of the signal that are related to the low intensity magnetic field detected by the sensing cell. In certain embodiments, the signal processing means includes computing means that is programmed to resolve the characteristics related to the low intensity magnetic field from the input signal. The signal in general may include contributions sensed by the magnetic polarization of the alkali metal vapor from sources other than the low intensity magnetic field being determined, such as magnetic noise or optical noise. The computing means provides a representation of the characteristics of the low intensity magnetic field detected by the sensing cell. The computing means can also operate to minimize or eliminate components in the signal originating from noise.

As described above, in certain embodiments, a first modulator 260 that modulates the first beam of radiation by a first modulation function and/or a second modulator 360 that modulates the second beam of radiation by a second modulation function, may be employed. In such cases, the at least one signal comprises a component modulated by the first modulation function or by the second modulation function, or both. In those cases, the modulation function or functions provide reference information for the computing means, and the computing means detects only components in the signal that are modulated by the first modulation function or the second modulation function, or both.

When the output detecting means includes several radiation detecting means, such as occurs for example in a photodiode array, a multichannel analyzer, a charge coupled detector, and so forth, each element in the array provides a signal to the signal processing means. The signal processing means, for example, the computing means contained therein, provides a representation of the low intensity magnetic field sensed by each element in the array. Frequently, a first array element detects radiation traversing one region of the alkali metal vapor and a second array element detects radiation traversing a different region of the vapor. It is frequently advantageous to compare and process the signals originating in each region of the alkali metal vapor by operating as a gradiometer, and to compensate or nullify common components in them that are ascribed to optical or magnetic background, noise, or comparable extraneous sources. In this way a further enhancement of sensitivity of detection may be achieved.

The novel features and attributes of the atomic magnetometer described in the foregoing are effective to provide an apparatus with a high sensitivity for characterizing the low intensity magnetic field to be assessed. Broadly, the sensitivity is such that the magnetometer detects a magnetic field that is smaller than a predetermined value. In various embodiments, the predetermined value may be less than about 1 femtotesla $(Hz)^{-1/2}$, or less than about 0.5 femtotesla $(Hz)^{-1/2}$, or less than about 0.2 femtotesla $(Hz)^{-1/2}$, or less than about 0.1 femtotesla $(Hz)^{-1/2}$, or even less. Recent embodiments show sensitivity of the magnetometer of the present invention should be as low as about 0.02 femtotesla $(Hz)^{-1/2}$ or 0.01 femtotesla $(Hz)^{-1/2}$. It is believed that limits of detection provide a level of sensitivity that is better than that of any magnetometer currently disclosed in the field.

Additional advantages of the instant magnetometer include the absence of a requirement for operation at cryogenic temperature, use of relatively inexpensive components, and relatively compact overall dimensions. The increased sensitivity furthermore permits the sensing cell to be kept to a size that is smaller than known in the field.

The atomic magnetometer described above may be used to detect and characterize low level magnetic fields from any source, provided the field produced by the source is apparent in the region of space occupied by the sensing cell. Sources of interest include geological specimens, forensic specimens, chemical specimens, industrial components, biological samples, components contained in explosives, and the like. An important requirement, as just noted, is that the field impinge on the sensing cell. Optimally this is achieved by placing a source or sample characterized by a low intensity magnetic field in the immediate vicinity of the sensing cell.

High Sensitivity by Tuning the Zeeman Resonance of Alkali Atoms to the RF Frequency and Partially Suppressing Spin-Exchange Collisions in the Alkali-Metal Vapor Most existing atomic magnetometers are designed for detection of quasi-static magnetic fields and at high frequency their sensitivity drops as 1/f. By tuning the Zeeman resonance of the atoms to the RF frequency it is possible to obtain the same sensitivity to RF fields as to the DC fields. For alkali-metal atoms the Zeeman transition frequency is given by $\omega_0 = g_s \mu_B B/(2I+1)\hbar$ and resonance frequencies from kHz to GHz can be obtained in a practical magnetic field. In the simplest arrangement, the atoms are polarized along a static magnetic field $B_z$ and the transverse polarization created by the RF field is detected using a laser. The transverse polarization created by an oscillating magnetic field $B_1 \hat{y} \cos \omega t$ is given by $$P_x = \gamma B_1 T_2 P_z / 2. \tag{1}$$

Hence, the sensitivity is proportional to the transverse spin relaxation time $T_2$. For alkali-metal atoms at high density, the transverse spin relaxation is dominated by spin-exchange collisions. While spin-exchange broadening can be completely eliminated at very low magnetic fields (Allred, J. C. et al., *Phys. Rev. Lett.* 89, 130801 (2002)), at higher field it can be partially suppressed by pumping nearly all atoms into a stretched state (Appelt, S. et al., *Phys. Rev. A* 59, 2078 (1999)). Our magnetometer operates in this regime.

The relative populations of the ground-state hyperfine sublevels are governed by the spin-temperature distribution (Anderson, L. W. et al., *Phys. Rev.* 116, 87 (1959)) with the spin-temperature parameter $\beta$ directly related to the polarization $P = \tan h(\beta/2)$, which is a function of the pumping rate R, the spin-destruction rate $R_{sd}$, and the degree of circular polarization $s_z$, $P = s_z R/(R+R_{sd})$ (Appelt, S. et al., *Phys. Rev. A* 58, 1412 (1998)). For monochromatic light and Lorentzian absorption profile, the pumping rate and light shift $\Omega L$ can be found from the photon flux Nph/A where A is the beam's area, $$R + i\Omega_L = r_e cf \frac{N_{ph}/A}{\Delta v/2 - i(v_a - v)}. \tag{2}$$

Here, $r_e$ is the classical electron radius, f is the oscillator strength of the optical transition, v is the laser frequency, $\upsilon_a$ is the frequency of the optical transition, and $\Delta \upsilon$ is the linewidth of the transition. In general the relaxation of transverse oscillations of spins is multi-exponential and the spectrum is a superposition of several Lorentzian curves; however, when pumping rate is sufficiently high, most atoms will occupy only one state with the maximum F and $m_{Fi}$ then it can be shown that the resonance is a single Lorentzian, and Eq. (9) in (Appelt, S. et al., *Phys. Rev. A* 59, 2078 (1999) can be used to evaluate the resonance width. Assuming that in the active volume the degree of circular polarization $s_z = 1$, this equation can be simplified without much loss of precision by expansion to first order in $R_{sd}$ to give $$\Gamma = \frac{R}{4} + \frac{R_{ex} R_{ad}}{2R}, \tag{3}$$

where $R_{ex}$ is the spin-exchange rate, $\Gamma = 1/T_2$, and $T_2$ is effective transverse relaxation time of the magnetic resonance. Although any birefringence of optics and the cell reduces the value of $s_z$ when the light propagates through an optically thick polarized vapor, $s_z$ increase back to 1 due to polarization purification which arises from exponential absorption of the "wrong" component of the light polarization. As a function of pumping rate, the width has the minimum $$\Gamma_{min} = \sqrt{R_{ex} R_{sd}/2}. \tag{4}$$

Because Eq. (3) is derived in the limit $R \gg R_{sd}$, it can not give the width at low pumping rate; however, the equation derived in (Happer, W. and Thin, A. C., *Phys. Rev. A* 16, 1877 (1977)) for the width of the dominant Zeeman resonance in the limit of slow spin-exchange rate, can be used to obtain maximum width, $$\Gamma_{max} = 0.125 R_{ex}. \tag{5}$$

Then, the light-narrowing is $$k = \frac{\Gamma_{max}}{\Gamma_{min}} = 0.177 \sqrt{R_{ex}/R_{ad}}. \tag{6}$$

This quantity provides good test of the optimization of the width, In the limit of high density, K—K collisions will dominate spin-destruction rate and the narrowing will be maximal and independent of the vapor density $$k_{max} = 0.177 \sqrt{\sigma_{ex}/\sigma_{sd}} = 24. \tag{7}$$

EXAMPLES

Example 1

Figure 5:
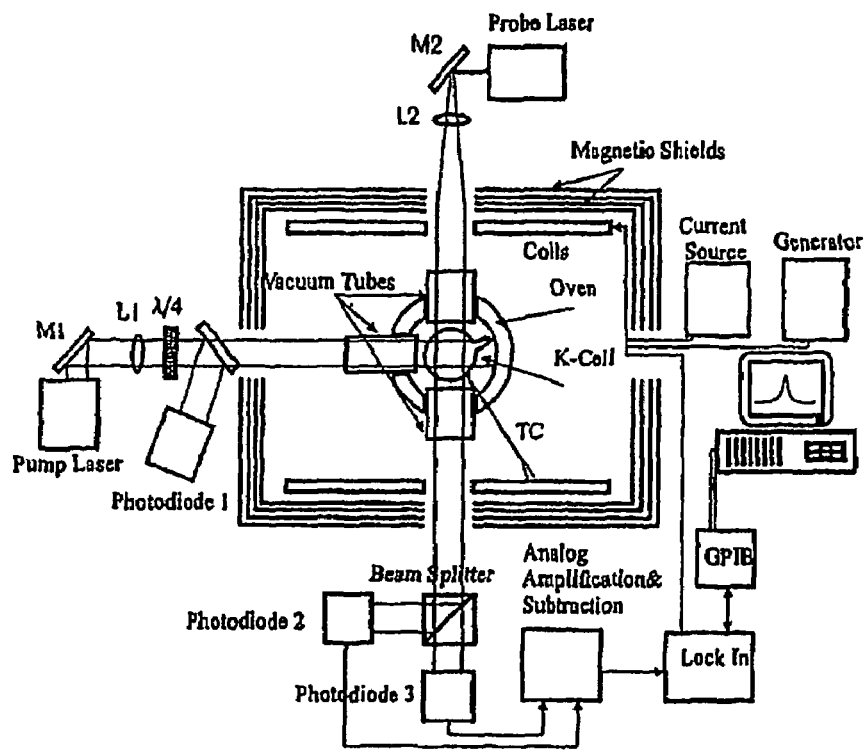
FIG. 5 is a schematic diagram of several components employed in one embodiment of an atomic magnetometer of the present invention.

An atomic magnetometer embodiment is shown in FIG. 5. This embodiment demonstrates magnetic field sensitivity of 2 fT/Hz$^{1/2}$ at a frequency of 99 kHz with a resonance width of 200 Hz. Also considered in this embodiment are the theoretical limits on the sensitivity of the RF magnetometer, showing that sensitivity of about 0.02 fT/Hz$^{1/2}$ for a 100 cm$^3$ measurement volume should be possible with quantum non-demolition measurements.

The principle of operation is similar to that of the ultrasensitive magnetometer described in (Allred, J. C. et al., *Phys. Rev. Lett.* 89, 130801 (2002)). The spin polarization is achieved via optical pumping with circularly polarized light, produced by a diode laser with a grating feedback for tuning the laser to the potassium D1 transition. The detection system is based on the measurement with the polarization beam splitter of the polarization rotation of the probe beam, generated by a 500 mW single-frequency commercial laser. A 1" square aluminosilicate glass cell containing 2.5 atm of $^4$He, 60 torr of $N_2$ and potassium in natural abundance is placed inside a double-wall glass oven in which hot air flows between the walls without crossing the probe and pump beams which pass through evacuated glass tubes. The oven is well insulated to reduce heat losses and heating of the inner magnetic shield. The magnetic shields consists of 6 concentric hollow μ-metal cylinders with caps providing a 10$^6$ reduction of external fields. Magnetic fields inside the shields are created by a set of coils driven by a precision current source.

Figure 6:
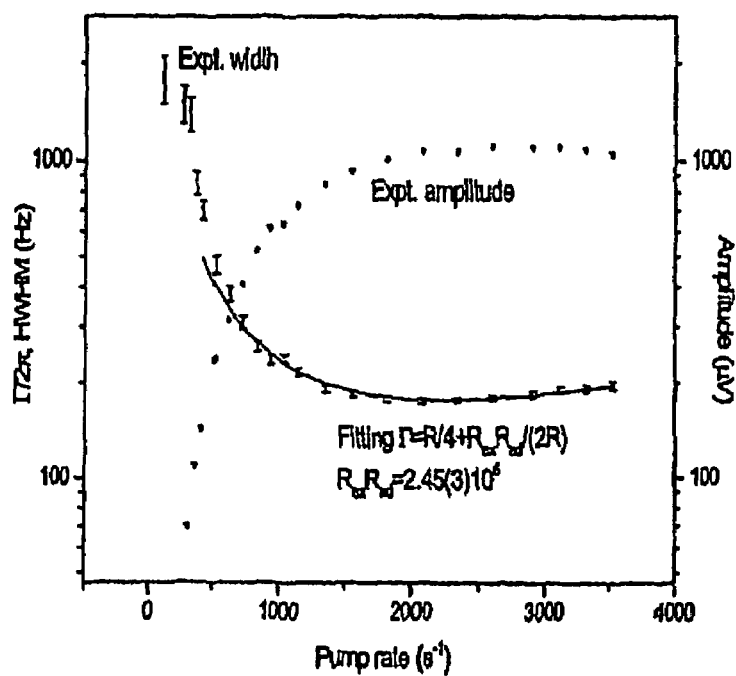
FIG. 6 illustrates a comparison of theory and experiment for the dependence of width on the intensity of the pump beam of the atomic magnetometer of FIG. 5.

FIG. 6 illustrates experimental studies of the dependence of the width and of the magnetometer signal on the pumping rate. Eq. (3) fits accurately experimental points and gives both the calibration of the pumping rate and the value of the product $R_{ex} + R_{sd}$. The deviation of the fit from experiment at low pumping rate is due to approximation used to derive Eq. (3) and due to nonlinear dependence of the pumping rate on the laser intensity. For this measurement, the theory is applicable when $R \gg 30$ s$^{-1}$. Also, when this inequality is satisfied, the drop in the pumping rate due to propagation in the vapor is $R_{sd} \alpha z$, where z is the propagation depth and α is the absorption coefficient which depends on the density of the vapor. The density is an important experimental parameter, which can be found from the experimental maximum width by using Eq. (5) and the known spin-exchange cross-section $1.8 \times 10^{-14}$ cm$^2$. The density of potassium was $5.7 \times 10^{13}$ cm$^3$, which gives $R_{sd}\alpha z$ about 350 s$^{-1}$. In FIG. 6 this value corresponds to the pumping rate where the fit starts to deviate from the experiment. Using the maximum width and the value of $R_{ex}R_{sd}$ obtained from the fit, the spin-destruction rate is 32 s$^{-1}$, in some agreement with calculations, 20 s$^{-1}$, which include the effects of K—K, K—He, and wall collisions. Also estimated is the pumping rate from measurements of pump power and the area of the beam to find that the calculated pumping rate is about two-times larger than obtained from the fit, which can be due to some absorption in the vapor and some uncertainty in actual geometry of the beam.

Figure 7:
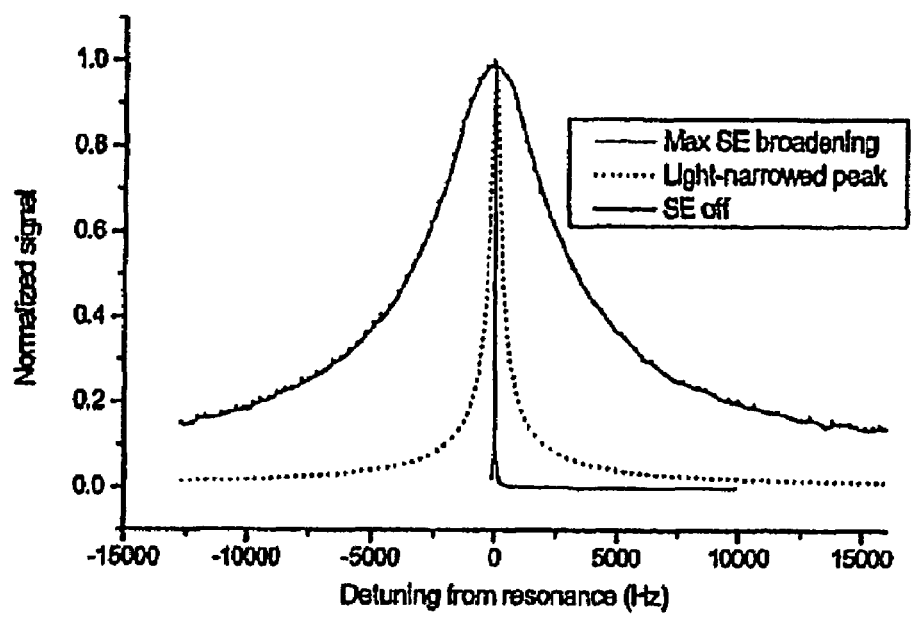
FIG. 7 illustrates a comparison of magnetometer spectral responses for different modes of operation for the atomic magnetometer of FIG. 5.

FIG. 7 compares magnetic resonance in three distinct regimes. A very broad spectrum with HWHM 1500 Hz results from spin-exchange collision when the precession frequency is faster than the spin-exchange collision rate and polarization is low. In this regime, the width can be found from Eq. (5). Dramatic narrowing by 10 times is achieved due to the light narrowing effect. Eq. (4). The narrowing is less than maximum possible 24 because of substantial contribution from buffer-gas arid wall collisions. Finally, an extremely narrow spectrum with the width about 1 Hz is obtained at a low frequency, when spin exchange is completely turned off and the broadening is only due to spin-destruction.

More specifically, FIG. 7 compares magnetometer spectral responses for different modes of operation: 1) maximum spin-exchange broadening occurs at low pump power and high frequency; 2) 10 times narrowing for the operation at the same frequency but at optimal pumping rate due to light-narrowing effect; and 3) the width is a close to spin-destruction frequency at high density and low frequency operation, SE broadening is completely turned off.

Using a lock-in amplifier or a narrow filter, magnetic and mechanical noise can be effectively removed and the sensitivity can in principle approach the fundamental spin-projection noise arising from the uncertainty principle $(\delta F_x)$ $(\delta F_y) \geq \hbar/2|F_x|$ for non-commuting operators of total angular momenta $[F_x, F_y] = i\hbar F_x$. For N atoms the uncertainty is reduced by $\sqrt{N}$, since fluctuations are independent. Continuous measurements also reduce uncertainty; however, these measurements are correlated. To calculate the noise a simple stochastic process can be assumed in which angular momentum information is completely destroyed after one correlation time. Then the uncertainty will be reduced by the square root of the number of independent measurements which is $t/t_{corr}$. For more appropriate exponential correlation function with $t/t_{corr}$ $T_2$, which better describes the behavior of the magnetometer, there is an additional factor of $\sqrt{2}$, so $(\delta F_x) \geq \sqrt{\hbar|F_x|t/T_2}$. Using Eq. (1) in which P can be replaced with F due to hyperfine interaction alignment, by setting $F_x = \langle \delta F_x \rangle$ and by solving for $B_j$, one can obtain the fundamental spin-projection limit $$\delta B = \frac{2}{\gamma} \sqrt{\frac{\hbar}{F_z n V t T_2}}, \tag{8}$$

where t is the measurement time, n is the atomic density, V is the volume of the cell.

Quantum fluctuations in the relative populations of the two polarization states in the nominally linearly-polarized probe beam can result in another source of noise. The fluctuating ellipticity $\delta s_x = \sqrt{1/N_{pr}}$ of the probe light, where $N_{pr}$ is the rate of photons traversing the cell, causes the atoms to experience a fluctuating light shift due to virtual absorption of the photons.

$$\delta B_{LS} = \frac{\Omega_L}{2\gamma \sqrt{N_{pr}}} \tag{9}$$

The factor of ½ appears because the counter-rotating component of this noise does not contribute.

Shot noise of the probe beam photons is an important source of noise if the vapor optical activity is small, as in the case of our high-frequency magnetometer, since it determines the minimal angle that can be detected. The probe beam's axis of polarization is rotated by an angle $$\theta = \frac{1}{2} l r_e c f n P_x D(v)_1. \tag{10}$$

where l is the length of the cell along the probe direction and $D(v) = (v - v_\alpha)/[(v - v_\alpha)^2 + (\Delta v/2)^2]$. The angular sensitivity can be easily measured. For our detection system based on the subtraction of intensities from the polarization beam splitter, small rotation angle Ø is related to the intensities in two channels $I_1$ and $I_2$ $$\phi = \frac{I_2 - I_1}{4I_1} \tag{11}$$

so the noise level in $I_2 - I_1$ is related directly to the noise in Ø. The photo-electron shot noise rms value per Hz$^{1/2}$ $$\phi_{shot}^{rms} = 1/\sqrt{N_{pr}\eta} \tag{12}$$

where η is the photo-diode quantum efficiency. Combining Eqs. (10,12) the shot-noise magnetic field sensitivity is $$\delta B = \frac{4}{\gamma l r_e c f n P_z T_2 D(v) \sqrt{N_{pr}\eta}} \tag{13}$$

Figure 8:
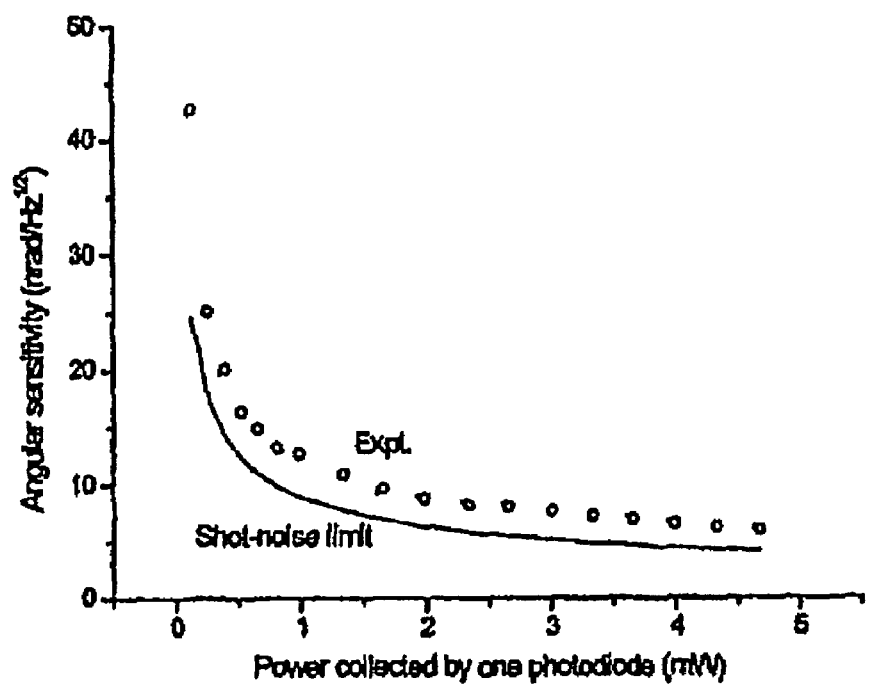
FIG. 8 illustrates angular sensitivity as a function of the single channel photodiode voltage for the atomic magnetometer of FIG. 5.

FIG. 8 illustrates the angular sensitivity of the detection system and compares it with the photon shot noise. Measured noise is somewhat larger due to frequency fluctuations which cause fluctuations of intensities from interference on optical surfaces. However, most of it is subtracted by detection scheme. For sufficiently large detuning $v - v_\alpha \gg \Delta v$ overall fundamental noise can be written $$\delta B = \frac{1}{\gamma \sqrt{nV}} \sqrt{\frac{4\hbar}{F_x T_2} + \frac{R_{pr}OD}{4} + \frac{64\hbar^2}{R_{pr}ODF_z^2 T_2^2 \eta}} \tag{14}$$

where $R_{pr} = r_e c f N_{pr} \Delta v / 2A(v - v_\alpha)^2$ is the probe beam spin-destruction rate, $T_2 = 1/(\sqrt{R_{ex}(R_{sd} + R_{pr})/2})$ is the transverse relaxation time maximized as a function of the pumping rate, and $OD = 2r_e c f n l / \Delta v$ is the optical depth at resonance. Eq. (14) has minimum at $OD = 16\hbar/R_{pr}F_x T_2 \sqrt{\eta}$.

$$\delta B_{min} = \frac{2}{\gamma}\sqrt{\frac{[R_{ex}(R_{sd}+R_{pr})]^{1/2}}{nV\sqrt{2}\,F_z/\hbar}\left(1+\frac{2}{\sqrt{\eta}}\right)} \quad (15)$$

If $R_{pr}$ can be neglected, the ultimate fundamental limit need not depend on the density of alkali-metal atoms $$\delta B_{ult,min} = \frac{2}{\gamma}\sqrt{\frac{<v>[\sigma_{ex}\sigma_{KK}]^{1/2}}{V\sqrt{2}\,F_x/\hbar}\left(1+\frac{2}{\sqrt{\eta}}\right)} \quad (16)$$

Substituting experimental values $T_2=2\pi\times 200$ s$^{-1}$, n=5.3× $10^{13}$ cm$^{-3}$, $\eta$=0.5, V=4 cm$^3$, we obtain $\delta B_{min}$=0.37 fT/Hz$^{1/2}$. The ultimate limit for the same volume $\delta B_{ult,min}$=0.2 fT/Hz$^{1/2}$, where we assumed $\sigma_{ex}$=1.8× $10^{-14}$ cm$^2$, $\sigma_{sd,KK}$=10$^{-18}$ cm$^2$, and $<v>$=6.8×10$^4$ cm/s.

Figure 9:
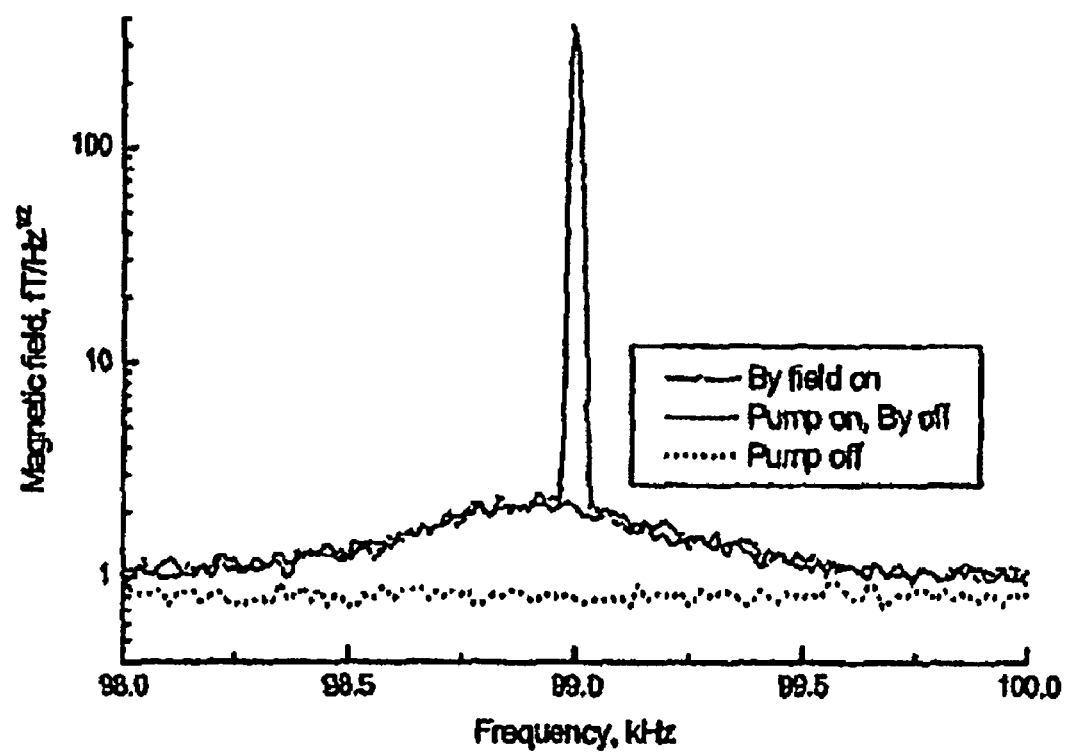
FIG. 9 illustrates the 2 $fT/Hz^{1/2}$ sensitivity of the atomic magnetometer of FIG. 5 at high frequency.

FIG. 9 demonstrates 2 fT/Hz$^{1/2}$ (1 fT/Hz$^{1/2}$) sensitivity of the magnetometer to the oscillating (rotating) field at 99 kHz. This sensitivity was limited by the noise from the pump laser, which is technical noise and can be excluded. The optical noise, that the is noise when the pump beam is blocked, is 0.7 fT/Hz$^{1/2}$, close to the shot-noise limit of the detection system, which can be still improved. The total noise which has spectral distribution matching the magnetic resonance is dominated by pump laser noise, which is strongly correlated to fine tuning of the laser current. This noise can be reduced at higher frequencies. In principle, it is possible to reach the fundamental limits of the sensitivity (limits imposed by spin projection, light-shift, and photon-shot noise simultaneously) which for the cell with the volume 4 cm$^3$ according to Eq. (15). Is 0.37 fT/Hz$^{1/2}$ for current value of the resonance width. Further improvement is possible by increasing $T_2$ by 2.4 times, since the maximum possible light narrowing is 2.4 times larger than observed in this experiment. The ultimate fundamental limit, according to Eq. (16) is 0.2 fT/Hz$^{1/2}$ to oscillating field and 0.1 fT/Hz$^{1/2}$ to rotating field. Because the fundamental noise scales as $1/\sqrt{V}$, it is possible to increase sensitivity to the level 0.02 fT/Hz$^{1/2}$ by using a practically reasonable cell with dimensions 10 by 10 by 3 cm. For an embodiment with large cells, it might be useful to send two pump beams in opposite directions to ensure uniform intensity distribution over the whole volume of the cell. Such sensitivity is important for NQR detection.

This embodiment poses consideration of using quantum non-demolition techniques to further improve the sensitivity of magnetometer. A quantum non-demolition measurement removes the contribution of the light shift fluctuation noise by restricting it to a spin projection orthogonal to the one being measured. This has been demonstrated in several examples with nearly static spins. It is possible to implement the same technique for rotating spins using a probe laser pulsed at the second harmonic of spin precession. By eliminating the effect of the light shift noise and optimizing the probe beam parameters, it is possible to realize the sensitivity given by 8, an improvement by a factor of approximately 2. Thus, quantum non-demolition measurements improve the sensitivity but do not allow one to achieve sub-shot noise.

The Example 1 embodiment demonstrates 1-2 fT/Hz$^{1/2}$ sensitivity of the magnetometer at 99 kHz, which was limited by photon-shot noise and pump laser noise. Further progress is possible by improving the stability of the pump laser and by optimization other experimental parameters until the ultimate fundamental limit is reached, which is about 0.02 fT/Hz$^{1/2}$ for V=100 cm$^3$. Also obtained was close agreement of results with the theory for resonance width and some other parameters. This high-frequency magnetometer can find many applications, including NMR, MRI, and nuclear-quadrupole resonance detection for explosives detection.

Example 2

The atomic magnetometer embodiment of Example 2 demonstrates a potassium RF magnetometer with sensitivity of 0.24 fT/Hz$^{1/2}$ operating at 423 kHz. The magnetometer was used to detect a $^{14}$N nuclear quadrupole resonance (NQR) signal from room temperature ammonium nitrate (NH$_4$NO$_3$) in the zero-applied field limit.

As an introduction, optically pumped alkali atom vapor can be used as a resonant receiver of a radio-frequency (RF) magnetic field, with a sensitivity potentially surpassing that of conventional induction coils especially in low frequencies (Savukov, I. M., et al., *Phys. Rev. Lett.* 95, 063004 (2005)). The resonance is achieved by applying a static magnetic field $B_0$ which tunes the ground state Zeeman splitting of the alkali atoms to the signal frequency. In this arrangement, an oscillating RF signal of amplitude $B_s$ applied perpendicular to $B_0$ induces a transverse polarization of the atomic spins given by $P_x \equiv F_x/F_z = (\frac{1}{2})\gamma B_s T_2$ in the rotating frame. Here F is the total angular momentum of the atoms, $\gamma$ is the gyromagnetic ratio, and $T_2$ is the transverse relaxation time of the polarization. The spin polarization oscillating in the laboratory frame is then probed by detecting the optical rotation of a linearly polarized laser beam passing through the vapor. Optical pumping of the atoms into the single Zeeman sublevel with the largest angular momentum projected along the pumping direction partially suppresses spin exchange interaction between the alkali atoms which causes resonance broadening in high fields (Appelt, S. et al., *Phys. Rev. A* 59, 2078 (1999)). This lengthening of $T_2$ is critical to achieve the high sensitivity of the magnetometer. Savukov, I. M., et al., *Phys. Rev. Lett.* 95, 063004 (2005) demonstrated a potassium RF magnetometer with sensitivity of 2 fT/Hz$^{1/2}$, limited by laser and ambient field noise. The calculated fundamental sensitivity, determined by quantum fluctuations, was at the level of 10$^{-2}$ fT/Hz$^{1/2}$.

Atomic magnetometers have recently been used to detect nuclear magnetic resonance (NMR) from thermally polarized water (Savukov, I. M and Romalis, M. V., *Phys. Rev. Lett.* 94, 123001 (2005) and Xu, S. et al., *Proc. Natl. Acad. Sci.* USA 103, 12668 (2006)) and laser polarized xenon (Savukov, I. M and Romalis, M. V., *Phys. Rev. Lett.* 94, 123001 (2005) with high sensitivity. Detection of NQR with no polarization enhancement is challenging because of the small size and short duration of the RF-induced signal. In light of potential applications of solid-state zero-field NQR in contraband detection, proposals have been made to improve upon the sensitivity of conventional pickup-coil detection by using superconducting resonators C. (Wilker, J. D. et al., *IEEE MTT-S International Microwave Symposium Digest*, Vol. 1 (2004), 143) and sensors (SQUIDs) (He, D. F. et al., *Supercond. Sci. Technol.* 19 (2006) S231-S234) operating at cryogenic temperatures. Our results demonstrate the first detection of NQR with an atomic magnetometer and show that a cryogen-free atomic magnetometer, with intrinsically frequency-independent sensitivity and easy tuning/damping capabilities, could make an attractive new tool for detecting magnetic resonance signals in the kHz to MHz range.

Figure 10A:
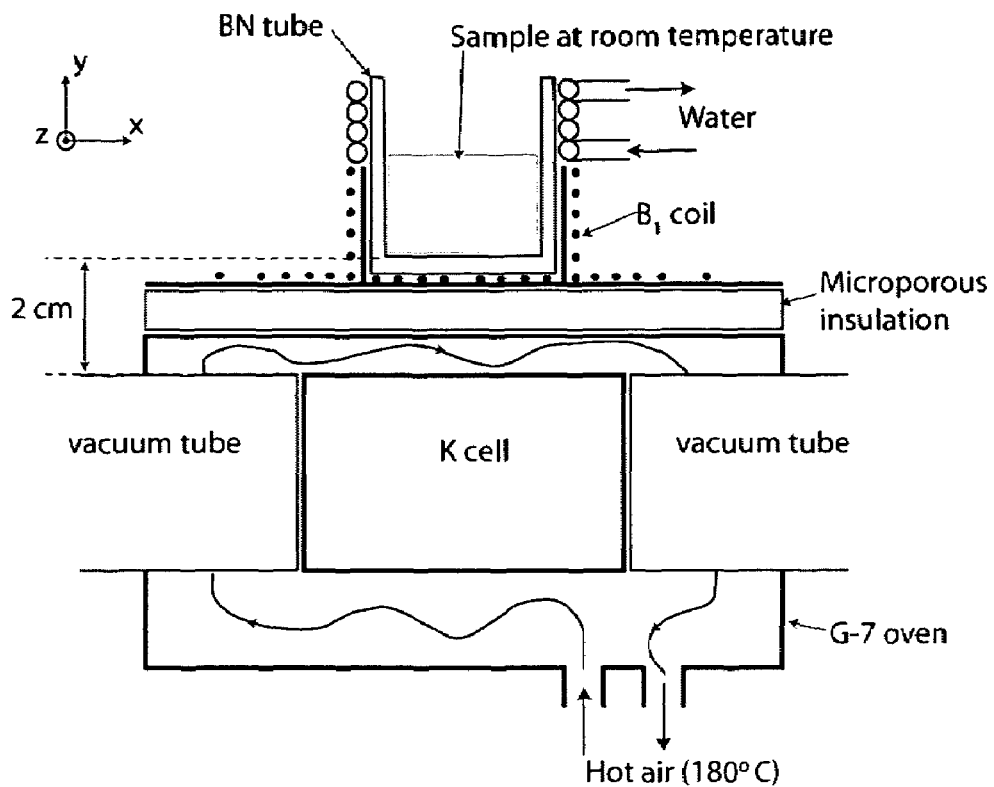
FIG. 10A is a schematic diagram of several components employed in another embodiment of an atomic magnetometer of the present invention, showing a boron nitride (BN) container and a K cell inside a hot air oven.
Figure 10B:
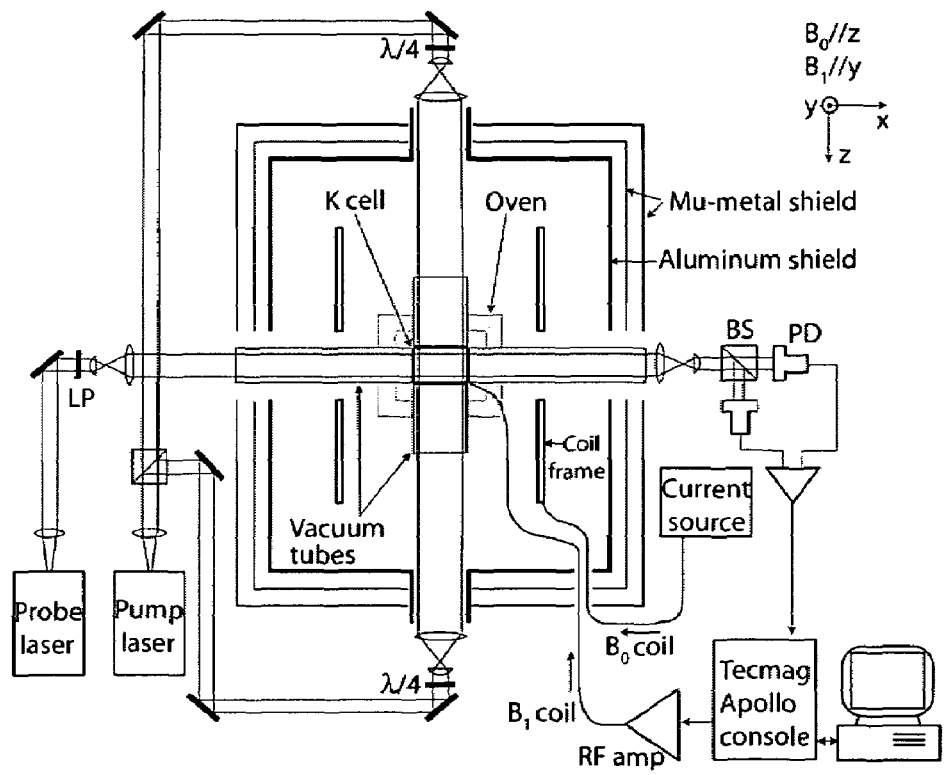
FIG. 10B is another schematic diagram view of atomic magnetometer of FIG. 10A, showing the pump and the probe beams, an RF (aluminum) and a static (mu metal) magnetic field shield, and balanced polarimeter with data acquisition setup (offset field ($B_{off}$) coils are not shown)

FIG. 10A illustrates a schematic of the Example 2 atomic magnetometer A borosilicate rectangular glass cell, with inner dimension of 40×40×60 mm³, was filled with a drop of potassium metal, 70 torr of $N_2$, and 630 torr of $^4$He at room temperature. The cell was placed in a G-7 fiberglass oven which was heated to 180° C. by hot air. The NQR sample was put in a high thermal-conductivity ceramic (boron nitride) container and was located on top of the oven, separated by a 6 mm-thick microporous insulation material. The separation between the bottom of the sample and the top of the K vapor was 2 cm. The $B_1$ coil for NQR excitation/refocusing pulses was constructed to minimize the rf field reaching the K cell. A continuous flow of chilled water in a plastic tube wrapped around the upper part of the boron nitride container kept the sample temperature at 24° C. within ±0.5° C. The sample and the oven were placed inside a single-layer aluminum and a double-layer mu metal shield; each layer of the shields had four holes in the xz plane for laser beam access (FIG. 10B). Four evacuated, rectangular glass tubes were placed in contact with the sensing cell (K cell) in order to secure turbulence-free paths for the laser beams.

More specifically, FIG. 10B illustrates the RF atomic magnetometer setup showing the pump and the probe beams, an RF (aluminum) and a static (mu metal) magnetic field shield, and balanced polarimeter with data acquisition setup. The offset field ($B_{off}$) coils, not shown, are directly wound on the two vacuum tubes along the pump beam direction (z axis) close to the K cell. LP, linear polarizer; λ/4, quarter-wave plate; BS, beam splitter; PD, photodiode.

The K atoms were optically pumped to |F=2; $m_F$=±2>Zeeman sublevel under a static magnetic field $B_0$=$B_0$z, by a high power (up to 400 mW) diode laser (Sacher Lasertechnik) tuned to the D1 line of potassium at λ=769.9 nm. The cell was illuminated from opposite directions along the z axis. This arrangement of the pump beam assists in the maintaining of nearly uniform light intensity across an optically thick vapor cell. The transverse polarization $P_x$ of the potassium atoms was measured by detecting the optical rotation of linearly polarized probe light using a balanced polarimeter. The probe beam was produced by a DFB-type diode laser with a tapered amplifier (Toptica Photonics) at a wavelength δλ≈0.1 nm away from optical resonance. Typical probe beam power reaching the K cell was about 40 mW. Both the pump beam and the probe beam were expanded by factors of up to 40 using two-stage refractive optics involving piano-convex and aspheric lenses to convert the initial Gaussian profile of the laser beam into a more uniform one over the illuminated volume of the cell.

Figure 11:
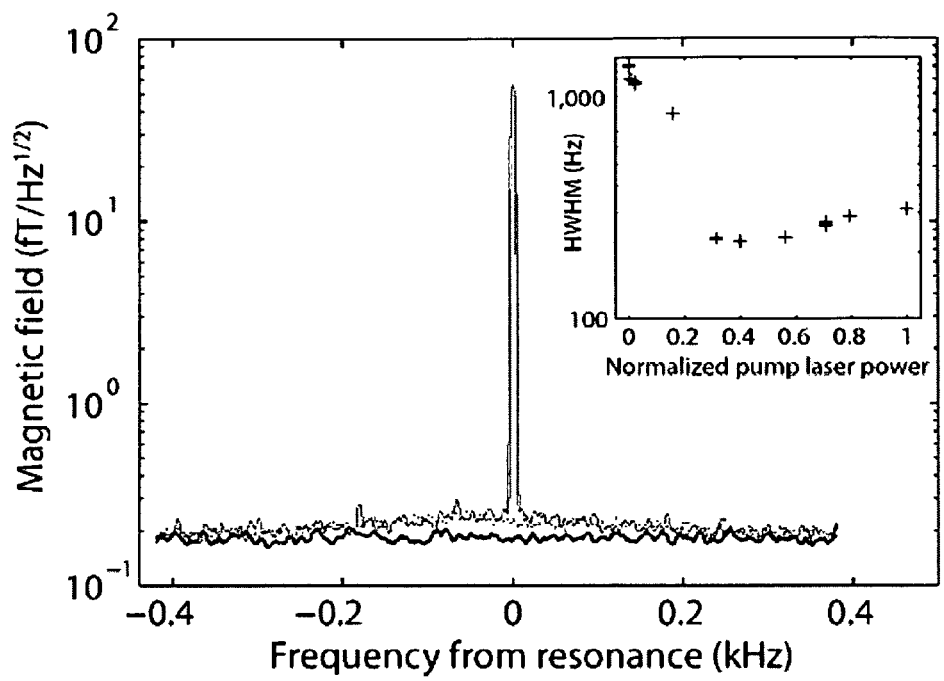
FIG. 11 illustrates noise spectrum of the atomic magnetometer of FIGS. 10A & 10B near 423 kHz obtained with (thin solid line) and without (dotted line) an applied RF field for calibration (the heavy solid line shows detection noise with pump beam off—the inset shows the resonance half width with varied pump beam power)

FIG. 11 illustrates the noise spectrum of the magnetometer which was tuned to $\omega_0/2\pi$=423 kHz by $B_0$=$\omega_0/\gamma_K$=0.604 G. The thin solid line shows the noise spectrum with, and the dotted line without, an applied RF field for calibration. Heavy solid line shows the detection noise when the pump beam was shut off. Here $\gamma_K$=2π×7.00·10⁵ Hz/G is the gyromagnetic ratio of ground state potassium. The calibration field, which appears as a peak at the center, was applied uniformly over the cell. The noise level was 0.24 fT/Hz$^{1/2}$. The noise near resonance decreases by no more than 20% when the pump beam is shut off, which indicates that neither the pump beam nor the external RF field fluctuation is the dominant source of the magnetometer noise. Instead, the frequency and intensity noise of the probe laser apparently is responsible for the detected noise, approximately 2 times larger than the shot noise of 0.1 fT/Hz$^{1/2}$. The inset of FIG. 11 shows the half-width as the pump beam power was varied, at half-maximum (HWHM) $\Gamma/2\pi$=1/($2\pi T_2$) of potassium Zeeman resonance as a function of the pump beam power. The width was obtained by sweeping applied RF field frequency at a constant $B_0$. Resonance line narrowing by strong optical pumping is apparent in the low pump power regime. The linewidth eventually grows as optical pumping destroys transverse polarization of K generated by the RF field. The minimum width of 220 Hz corresponds to a magnetometer Q value of 1000. The estimated maximum power reaching the K cell was about 150 mW.

Free spin precession in NQR can be induced by an RF pulse applied in the same direction as the detection direction (Bloom, M. Hahn, E. L., Herzog, B. *Phys. Rev.* 97, 1699 (1955)). For a resonant RF pulse applied to a spin-1 nucleus in a powdered sample, the induced signal varies with the "tipping angle" $\theta=\gamma_N B_1 t$ as $S\alpha J_{3/2}(\theta)/\sqrt{\theta}$ (Vega, *J. Chem. Phys.* 61, 1093 (1974)). Here $B_1$ and t are the RF pulse amplitude and length, respectively, and $J_{3/2}$ is the Bessel function of order ³⁄₂. Here and in what follows the subscript N is used to distinguish the gyromagnetic ratio and relaxation times of nuclear spins from those of K atomic spin. Since the gyromagnetic ratio of K is more than 2000 times larger than that of $^{14}$N, even a small fraction of the RF pulse amplitude that couples to the tuned magnetometer will easily saturate the magnetometer, diminishing the K polarization. To prevent this, two techniques are adopted in this embodiment. First, the RF excitation coil was designed to be "single sided" by connecting the solenoidal RF coil in series with a planar coil which was inserted between the sample container and the oven (FIG. 10A). The planar coil canceled the RF field generated by the solenoid in the region of the K vapor with a cancellation factor of about 80. Second, a pulsed detuning field $B_{off}$ was employed along the z axis to offset the K magnetic resonance frequency to about 2 MHz, while RF pulses of $B_1$=4.5 G were applied. The offset field was also highly inhomogeneous, so that any transverse K polarization created by the RF pulse quickly dephased. At the end of an RF pulse, the offset field was slowly ramped down so that K spins adiabatically followed the net field $B_0+B_{off}$. The magnetometer recovers its normal sensitivity within 0.8 ms after the termination of an RF pulse. In comparison, magnetometer recovery time without the offset field was on the order of 30 ms, somewhat longer than the optical depth (OD =62, estimated from absorption spectrum) divided by the pumping rate (~7000 sec$^{-1}$, calculated from the photon flux).

Figure 12A:
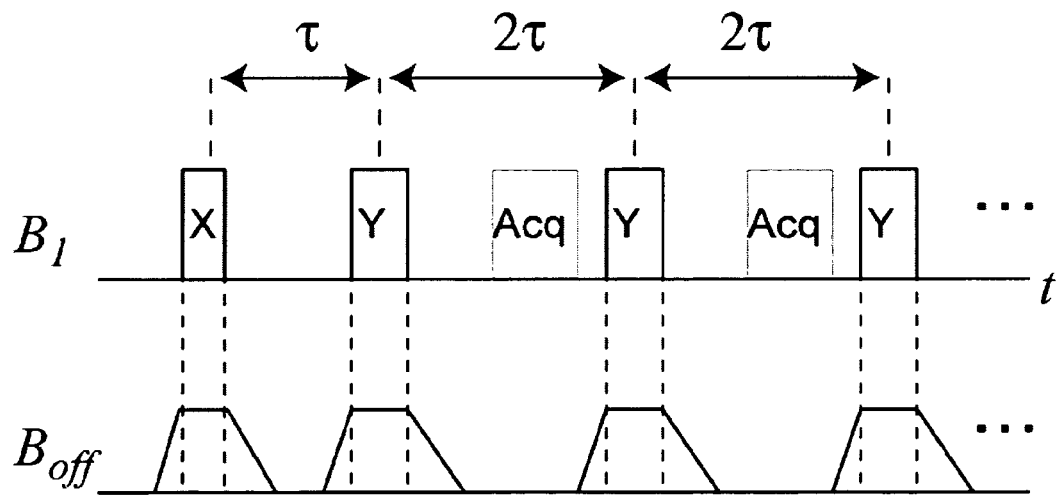
FIG. 12A illustrates a timing diagram of the excitation $\theta=119°_X$ and refocusing $\theta=150°_Y$ RF pulses and offset field pulses for the atomic magnetometer of FIGS. 10A & 10B (grey boxes indicate the acquisition window)
Figure 12B:
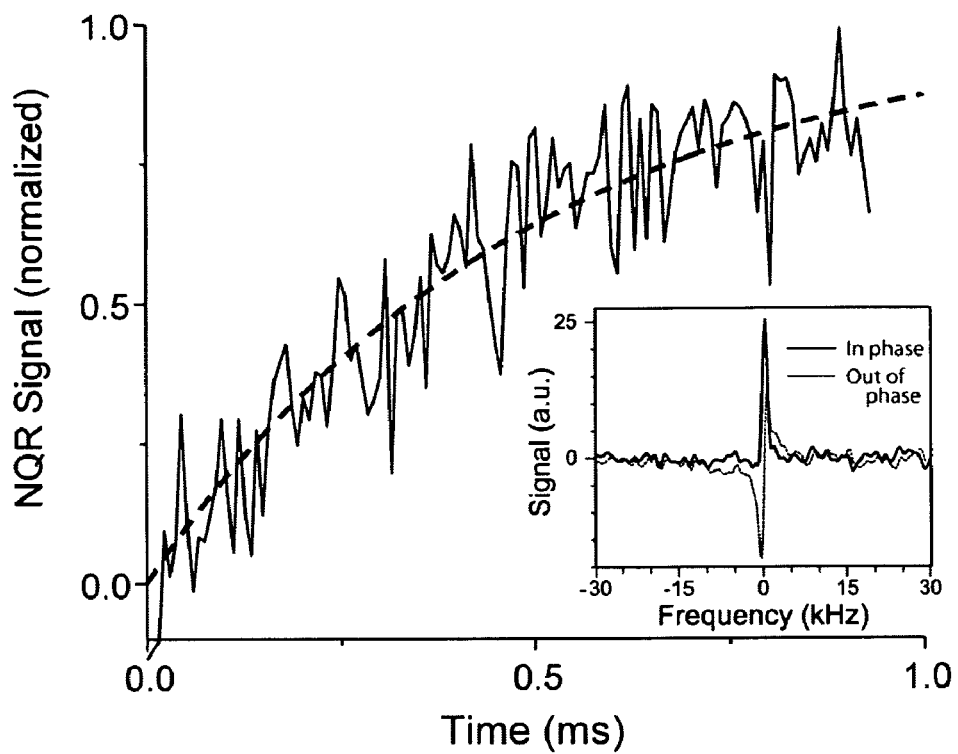
FIG. 12B illustrates lock-in detected $^{14}$N NQR signal from powdered ammonium nitrate in the acquisition window for the atomic magnetometer of FIGS. 10A & 10B (dashed line is a single exponential fit with a rise time of 0.49 ms—inset shows a Fourier transform of the signal obtained in a different run, with total $T_{1N}$—limited acquisition time of 4 minutes)
Figure 12C:
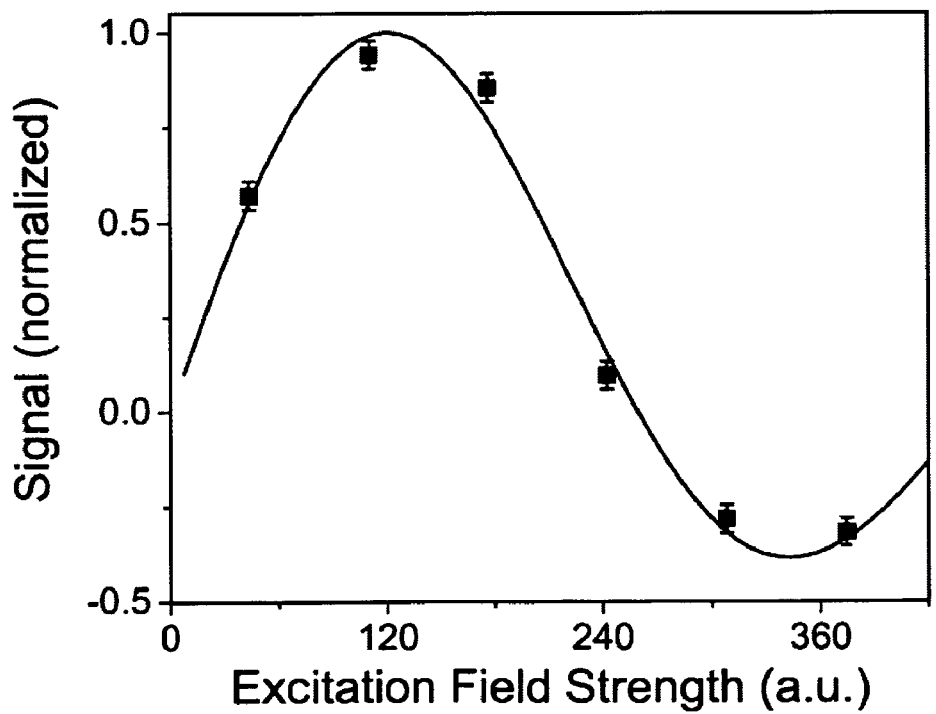
FIG. 12C illustrates the NQR signal amplitude as a function of the excitation pulse strength for the atomic magnetometer of FIGS. 10A & 10B.

Because of the long $T_{1N}$=16.6 s>>$T_{2N}$=4.4 ms of $^{14}$N, the NQR signal was detected with a spin-lock spin-echo sequence (Marino, R. A. and Klainer, S. M. *Chem. Phys.* 67, 3388 (1977)) shown in FIG. 12A. Here the initial excitation of the spins is followed by a series of refocusing pulses to form multiple spin echoes at intervals of 2τ=2.2 ms. The magnetometer acquired signals during 1 ms acquisition windows between these pulses. The output of the polarimeter, after analog amplification, was detected in quadrature with a Tecmag Apollo console. FIG. 12B illustrates the averaged echo signal after 32 repetitions of a 2048-echo sequence. The initial rise of the signal is due to the high Q of the magnetometer. The inset shows the Fourier spectrum of the signal after 8 repetitions of the same sequence. The measured SNR of 25 corresponds to a SNR of 9 from a single such sequence that lasts for 4.4 sec. Due to the long $T_{1N}$, the repetition rate was low, at about twice per minute. FIG. 12C shows the signal amplitude as a function of the excitation pulse amplitude, demonstrating good agreement with the predicted Bessel-function dependence.

The subfemtotesla atomic magnetometer embodiment of Example 2 demonstrates sensitive detection of an NQR signal from a room temperature solid. Among the three quantum-limited noise terms identified in (Savukov, I. M., et al., *Phys. Rev. Lett.* 95, 063004 (2005)), the photon shot noise term is found to be dominant in our setup due to relatively low probe beam intensity. Furthermore, excess noise from probe beam fluctuations raised the detected noise level to about twice that of the shot noise. With a more stable laser, and a moderate probe beam power of around 100 mW, a shot noise limited sensitivity of 0.05 fT/Hz$^{1/2}$ should be readily possible. As a comparison, NQR was detected from $NH_4NO_3$ using a conventional, tuned-coil based probe with a loaded Q of 60 and a coil volume comparable to that of the magnetometer cell. The measured SNR corresponded to a field sensitivity of 3.6 fT/Hz$^{1/2}$ at 423 kHz, where the field refers to the average field over the coil. Following Garroway, A. N. et al., *IEEE Trans. Geosci. Remote Sens.* 39, 1108 (2001), the Johnson noise limited sensitivity of the same probe was calculated to be 0.8 fT/Hz$^{1/2}$. It is therefore concluded that the demonstrated sensitivity of the present atomic magnetometer compares favorably with that of conventional pick-up coil probes for samples that have to be remotely detected. Work continues to realize sensitive detection in a more open environment, where external RF noise is canceled by subtracting signals from more than one probe beams. Further development will lead to a mobile atomic NQR spectrometer for various field applications.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention.

What is claimed:

1. An atomic magnetometer that detects and represents a first magnetic field originating within a sample volume, the magnetometer comprising:
    a sensing cell sensitive to high intensity magnetic fields comprising an alkali metal vapor, the sensing cell being adjacent to a sample volume including a component generating a first magnetic field, wherein the sensing cell is exposed to:
        the first magnetic field; and
        a background magnetic field to tune and maintain magnetometer operation at high frequency;
    a polarizing transmitter that increases a magnetic polarization of the alkali metal vapor, wherein the magnetic polarization of the alkali metal vapor includes a contribution from the first magnetic field;
    a magnetizer that imposes the background and a second magnetic field on a volume of space comprising the sensing cell;
    a probing interrogator that probes the magnetic polarization of the alkali metal vapor, the interrogator providing an output from the alkali metal vapor that includes characteristics related to the first magnetic field; and
    a measuring module that receives the output, determines the characteristics of the first magnetic field, and provides a representation of the first magnetic field.

2. The atomic magnetometer of claim 1, wherein the high frequency of magnetometer operation is at or above approximately 1 kHz.

3. The atomic magnetometer of claim 1, wherein the second magnetic field comprises a pulsed detuning field that offsets a magnetic resonance frequency of the alkali metal vapor.

4. The atomic magnetometer of claim 3, wherein the magnetic resonance frequency is offset to about 2 MHz.

5. The atomic magnetometer of claim 1, wherein the magnetizer includes excitation coils comprising a solenoidal RF coil in series with a planar coil in a vicinity of the first magnetic field.

6. The atomic magnetometer of claim 5, wherein the planar coil cancels a RF field generated by the solenoidal RF coil in the vicinity of the first magnetic field.

7. The atomic magnetometer of claim 1, wherein the polarizing transmitter is an optical pumping laser, and a half-width at half-maximum of a Zeeman resonance of the alkali metal vapor as provided by the optical pumping laser is a function of a power of the laser, and the power of the laser is selected to provide a minimal half-width at half-maximum.

8. The atomic magnetometer of claim 1, wherein the first magnetic field is generated by a component including nitrogen.

9. The atomic magnetometer of claim 1, wherein a limit of detectability of the atomic magnetometer is about 0.2 femtotesla (Hz)$^{-1/2}$.

10. A method for detecting and representing a low intensity magnetic field in the radio-frequency (RF) range using an atomic magnetometer with sensing cell having a high sensitivity to the low intensity magnetic field, the method comprising the steps of:
    increasing magnetic polarization of alkali metal vapor included in the sensing cell to tune a Zeeman resonance of the alkali metal vapor to high frequency, thereby increasing the sensitivity of the alkali metal vapor to the low intensity magnetic field;
    reorienting the magnetic polarization of the alkali metal vapor using a magnetic field;
    probing the magnetic polarization of the reoriented alkali metal vapor to provide an output having characteristics related to the low intensity magnetic field; and
    determining the characteristics of the low intensity magnetic field from the output, and providing a representation of the characteristics of the low intensity magnetic field.

11. The method of claim 10, wherein the high frequency is defined as at or above approximately 1 kHz.

12. The method of claim 10, wherein the magnetic polarization of the alkali metal vapor is reoriented by illumination in opposite directions of a similar plane.

13. The method of claim 12, wherein the magnetic polarization of the alkali metal vapor is further reoriented using a pulsed detuning magnetic field that offsets the magnetic resonance frequency of the alkali metal vapor.

14. The method of claim 10, wherein the magnetic polarization of the alkali metal vapor is reoriented using a laser, and a half-width at half-maximum of the Zeeman resonance of the alkali metal vapor as provided by the laser is a function of a power of the laser, and the power of the laser is selected to provide a minimal half-width at half-maximum.

15. The method of claim 10, wherein the magnetic polarization of the alkali metal vapor is reoriented using a pulsed detuning magnetic field that offsets the magnetic resonance frequency of the alkali metal vapor.

16. The method of claim 15, wherein the magnetic resonance frequency is offset to about 2 MHz.

17. The method of claim 10, wherein the magnetic polarization of the alkali metal vapor is reoriented using excitation coils comprising a solenoidal RF coil in series with a planar coil in a vicinity of the low intensity magnetic field.

18. The method of claim 17, wherein the planar coil cancels a RF field generated by the solenoidal RF coil in the vicinity of the low intensity magnetic field.

19. The method of claim 10, wherein the low intensity magnetic field is generated by a nitrogen containing substance.

20. A high sensitivity atomic magnetometer for detecting and representing a low intensity magnetic field in the radio-frequency (RF) range, the magnetometer comprising:
   a sensing cell including an alkali metal vapor and a buffer gas, wherein the sensing cell is exposed to a background magnetic field to tune a Zeeman resonance of the alkali metal vapor to high frequency;
   a polarizing transmitter that increases a magnetic polarization of the alkali metal vapor, thereby increasing the sensitivity of the alkali metal vapor to the low intensity magnetic field, by laser illumination of the sensing cell in opposite directions of a single plane, wherein power of the laser is selected to provide a minimal half-width at half-maximum of the Zeeman resonance of the alkali metal vapor;
   a magnetizer that imposes a pulsed detuning magnetic field on a volume of space including the sensing cell that offsets the magnetic resonance frequency of the alkali metal vapor;
   a probing interrogator that probes the magnetic polarization of the alkali metal vapor, the interrogator providing an output from the alkali metal vapor that includes characteristics related to the low intensity magnetic field; and
   a measuring module that receives the output, determines the characteristics of the low intensity magnetic field, and provides a representation of the low intensity magnetic field.

* * * * *